United States Patent
Jin et al.

(10) Patent No.: US 8,225,186 B2
(45) Date of Patent: Jul. 17, 2012

(54) ECODING AND DECODING METHODS AND APPARATUS FOR USE IN A WIRELESS COMMUNICATION SYSTEM

(75) Inventors: Hui Jin, Clinton, NJ (US); Tom Richardson, South Orange, NJ (US); Rajiv Laroia, Far Hills, NJ (US); Junyi Li, Bedminster, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 1335 days.

(21) Appl. No.: 11/487,032

(22) Filed: Jul. 14, 2006

(65) Prior Publication Data

US 2008/0260073 A1  Oct. 23, 2008

(51) Int. Cl.
*H03M 13/00* (2006.01)
*H03M 13/03* (2006.01)

(52) U.S. Cl. .................. 714/794; 714/795; 714/755

(58) Field of Classification Search .................. 714/794, 714/795, 755

See application file for complete search history.

(56) References Cited

U.S. PATENT DOCUMENTS

| | | | |
|---|---|---|---|
| 5,335,010 A | 8/1994 | Lindemeier et al. | |
| 5,907,577 A | 5/1999 | Hoole | |
| 5,911,120 A | 6/1999 | Lee et al. | |
| 5,940,434 A | 8/1999 | Lee et al. | |
| 6,023,783 A * | 2/2000 | Divsalar et al. | 714/792 |
| 6,172,970 B1 | 1/2001 | Ling et al. | |
| 6,297,691 B1 | 10/2001 | Anderson et al. | |
| 6,353,911 B1 | 3/2002 | Brink | |
| 6,377,610 B1 * | 4/2002 | Hagenauer et al. | 375/136 |
| 6,771,706 B2 | 8/2004 | Ling et al. | |
| 6,847,678 B2 | 1/2005 | Berezdivin et al. | |
| 6,925,107 B2 * | 8/2005 | Hagenauer et al. | 375/147 |
| 6,925,561 B1 | 8/2005 | Hunt et al. | |
| 6,947,491 B2 * | 9/2005 | Shahrier | 375/262 |
| 6,968,021 B1 * | 11/2005 | White et al. | 375/340 |
| 7,006,848 B2 | 2/2006 | Ling et al. | |
| 7,024,218 B2 | 4/2006 | Bender | |
| 7,058,873 B2 | 6/2006 | Song et al. | |

(Continued)

FOREIGN PATENT DOCUMENTS

EP  0622911  11/1994

(Continued)

OTHER PUBLICATIONS

Written Opinion—PCT/US07/073556, International Searching Authority—European Patent Office, Jan. 15, 2008.

(Continued)

*Primary Examiner* — Joseph D Torres
(74) *Attorney, Agent, or Firm* — Paul Holdaway; Nicholas J. Pauley; Jonathan T. Velasco

(57) ABSTRACT

The claimed subject matter relates to encoding and decoding information in a wireless communication system using soft-demodulation and interleaving of concatenated code received in a strip channel. A set of symbols is received containing a plurality of information bits, dividing the received set of symbols into a plurality of subsets of symbols, each subset corresponding to the input of an inner code demodulation selecting a set of initial a priori values of the inner code demodulation for each subset of symbols, and demodulating each subset of symbols, using the initial a priori values of the subset of symbols and an inner code generator matrix, to generate a plurality of first soft information values as the output of the inner code demodulation.

25 Claims, 14 Drawing Sheets

U.S. PATENT DOCUMENTS

| | | | |
|---|---|---|---|
| 7,088,793 B1 * | 8/2006 | Mickelson et al. | 375/341 |
| 7,142,864 B2 | 11/2006 | Laroia et al. | |
| 7,146,553 B2 | 12/2006 | Jarchi et al. | |
| 7,184,772 B2 | 2/2007 | Lim et al. | |
| 7,246,296 B2 * | 7/2007 | Yokokawa et al. | 714/755 |
| 7,391,774 B2 | 6/2008 | Lim et al. | |
| 7,444,119 B2 | 10/2008 | Bekritsky | |
| 7,558,554 B2 | 7/2009 | Hoo et al. | |
| 7,590,195 B2 * | 9/2009 | Wang et al. | 375/340 |
| 7,602,838 B2 * | 10/2009 | Bottomley et al. | 375/148 |
| 2002/0085641 A1 | 7/2002 | Baum | |
| 2002/0155852 A1 | 10/2002 | Bender | |
| 2003/0003880 A1 | 1/2003 | Ling et al. | |
| 2003/0069299 A1 | 4/2003 | Walter et al. | |
| 2003/0203721 A1 | 10/2003 | Berezdivin et al. | |
| 2004/0002340 A1 | 1/2004 | Lim et al. | |
| 2004/0081131 A1 | 4/2004 | Walton et al. | |
| 2004/0114566 A1 | 6/2004 | Lim et al. | |
| 2004/0228320 A1 | 11/2004 | Laroia et al. | |
| 2005/0181799 A1 | 8/2005 | Laroia et al. | |
| 2005/0186921 A1 | 8/2005 | Hoo et al. | |
| 2005/0259723 A1 | 11/2005 | Blanchard | |
| 2006/0116182 A1 | 6/2006 | Bekritski | |
| 2006/0291582 A1 | 12/2006 | Walton et al. | |
| 2007/0115800 A1 | 5/2007 | Fonseka et al. | |
| 2007/0230324 A1 | 10/2007 | Li et al. | |
| 2008/0014891 A1 | 1/2008 | Jin et al. | |
| 2008/0014975 A1 | 1/2008 | Jin et al. | |
| 2008/0260073 A1 * | 10/2008 | Jin et al. | 375/340 |
| 2009/0003880 A1 | 1/2009 | Marumonto | |

FOREIGN PATENT DOCUMENTS

| | | |
|---|---|---|
| EP | 0798878 | 10/1997 |
| EP | 1032153 | 8/2000 |
| EP | 1091447 | 4/2001 |
| GB | 2390514 | 1/2004 |
| JP | 7135492 A | 5/1995 |
| JP | 9502318 | 3/1997 |
| JP | 9162850 A | 6/1997 |
| JP | 9321678 A | 12/1997 |
| JP | 11205273 A | 7/1999 |
| JP | 2000041078 A | 2/2000 |
| JP | 20000512094 T | 9/2000 |
| JP | 2001156689 | 6/2001 |
| JP | 2001518250 A | 10/2001 |
| JP | 2003507944 T | 2/2003 |
| JP | 2004145972 A | 5/2004 |
| JP | 2006524966 T | 11/2006 |
| JP | 2007525043 T | 8/2007 |
| JP | 2007536846 T | 12/2007 |
| KR | 200369299 | 8/2003 |
| WO | WO9746044 | 12/1997 |
| WO | WO0113655 A1 | 2/2001 |
| WO | 2004075023 | 9/2004 |
| WO | WO2004095851 | 11/2004 |
| WO | 2005107304 | 11/2005 |

OTHER PUBLICATIONS

International Search Report—PCT/US07/073556, International Search Authority—European Patent Office—Jan. 15, 2008.

PCT Intern ational Search Report, for International Application No. PCT/US2006/008772, pp. 1-4, Aug. 3, 2006.

* cited by examiner

ECODING AND DECODING METHODS AND APPARATUS FOR USE IN A WIRELESS COMMUNICATION SYSTEM

CROSS-REFERENCE

This application contains subject matter related to U.S. patent application Ser. No. 11/249,770, entitled METHODS AND APPARATUS FOR TRANSMITTING SIGNALS FACILITATING ANTENNA CONTROL, filed on Oct. 13, 2005, the entirety of which is hereby incorporated by reference.

BACKGROUND

I. Field

The following description relates generally to communications systems, and more particularly to data encoding and decoding in a wireless communication system.

II. Background

Wireless networking systems have become a prevalent means to communicate with others worldwide. Wireless communication devices, such as cellular telephones, personal digital assistants, and the like have become smaller and more powerful in order to meet consumer needs and to improve portability and convenience. Consumers have become dependent upon these devices, demanding reliable service, expanded areas of coverage, additional services (e.g., web browsing capabilities), and continued reduction in size and cost of such devices.

A typical wireless communication network (e.g., employing frequency, time, and code division techniques) includes one or more base stations that provides coverage areas to subscribers as well as mobile (e.g., wireless) devices that can transmit and receive data within the coverage areas. A typical base station can simultaneously transmit multiple data streams to multiple devices for broadcast, multicast, and/or unicast services, wherein a data stream is a stream of data that can be of independent reception interest to a user device. A user device within the coverage area of that base station can be interested in receiving one, more than one or all the data streams carried by the composite stream. Likewise, a user device can transmit data to the base station or another user device.

In conventional multiple-input multiple-output (MIMO) receivers, a separate receive chain is required for each receive antenna. A strip channel is a dedicated resource that may be utilized by a base station for broadcasting. For example a non-beacon strip channel may permit a base station to broadcast information in a prescribed format, when information bits may be coded across one or more strip channels. However, conventional strip channels lack robustness when confronted with channel frequency selectivity, unreliable channel estimation, or the like. An unmet need exists in the art for systems and/or methodologies that mitigate interference and improve frequency diversity to overcome the afore-mentioned deficiencies.

SUMMARY

The following presents a simplified summary in order to provide a basic understanding of some aspects of the claimed subject matter. This summary is not an extensive overview, and is not intended to identify key/critical elements or to delineate the scope of the claimed subject matter. Its sole purpose is to present some concepts in a simplified form as a prelude to the more detailed description that is presented later.

According to various aspects, a method of decoding a communication signal may comprise receiving a set of symbols containing a plurality of information bits, dividing the received set of symbols into a plurality of subsets of symbols, each subset corresponding to the input of an inner code demodulation selecting a set of initial a priori values of the inner code demodulation for each subset of symbols, and demodulating each subset of symbols, using the initial a priori values of the subset of symbols and an inner code generator matrix, to generate a plurality of first soft information values as the output of the inner code demodulation. The method may further comprise associating each of the first soft information values to one of the plurality of information bits using an outer code generator matrix, calculating a plurality of second soft information values as the output of the outer code demodulation, wherein each second soft information value corresponds to one of the information bits and is calculated using at least two of the first soft information values associated with the information bit, determining a new set of a priori values of the inner code demodulation for each subset of symbols, using the second soft information values and the outer code generator matrix, and replacing the initial a priori values with the new a priori values, and repeating the demodulating, associating, calculating and determining actions at least once.

According to another aspect, an apparatus that facilitates decoding a communication signal, comprising a receiver that receives a set of symbols containing a plurality of information bits and divides the received set of symbols into a plurality of subsets of symbols, a decoder that selects a set of initial a priori values of the inner code demodulation for each subset of symbols, and an inner code demodulator that demodulates each subset of symbols, using the initial a priori values of the subset of symbols and an inner code generator matrix, to generate a plurality of first soft information values. The apparatus may further comprise an interleaver that associates each of the first soft information values to one of the plurality of information bits using an outer code generator matrix; an outer code demodulator that calculates a plurality of second soft information values, wherein each second soft information value corresponds to one of the information bits and is calculated using at least two of the first soft information values associated with the information bit, and a de-interleaver that determines a new set of a priori values of the inner code demodulation for each subset of symbols, using the second soft information values and the outer code generator matrix, and replaces the initial a priori values with the new a priori values for a next iteration of demodulation of the subsets of symbols.

Another aspect relates to an apparatus that facilitates decoding a signal that enables antenna switching at a wireless terminal, comprising means for receiving a set of symbols containing a plurality of information bits, means for dividing the received set of symbols into a plurality of subsets of symbols, each subset corresponding to the input of an inner code demodulation, means for selecting a set of initial a priori values of the inner code demodulation for each subset of symbols, and means for demodulating each subset of symbols, using the initial a priori values of the subset of symbols and an inner code generator matrix, to generate a plurality of first soft information values as the output of the inner code demodulation. The apparatus may further comprise means for associating each of the first soft information values to one of the plurality of information bits using an outer code generator matrix, means for calculating a plurality of second soft information values as the output of the outer code demodulation, wherein each second soft information value corresponds to one of the information bits and is calculated using at least two of the first soft information values associated with the information bit, means for determining a new set of a priori values of the inner code demodulation for each subset of symbols, using the second soft information values and the outer code generator matrix, and replacing the initial a priori values with the new a priori values, and means for repeating the demodulating, associating, calculating and determining actions at least once.

Still another aspect relates to a computer-readable medium that stores computer-executable instructions for receiving a set of symbols containing a plurality of information bits, dividing the received set of symbols into a plurality of subsets of symbols, selecting a set of initial a priori values of the inner code demodulation for each subset of symbols, and demodulating each subset of symbols, using the initial a priori values of the subset of symbols and an inner code generator matrix, to generate a plurality of first soft information values. The instructions may further comprise associating each of the first soft information values with one of the plurality of information bits using an outer code generator matrix, calculating a plurality of second soft information values, wherein each second soft information value corresponds to one of the information bits and is calculated using at least two of the first soft information values associated with the information bit, determining a new set of a priori values of the inner code demodulation for each subset of symbols, using the second soft information values and the outer code generator matrix, and replacing the initial a priori values with the new a priori values, and repeating the demodulating, associating, calculating and determining actions at least once.

Yet another aspect relates to a processor that executes computer-executable instructions for decoding a signal that enables antenna switching in a wireless terminal, the instructions comprising receiving a set of symbols containing a plurality of information bits, dividing the received set of symbols into a plurality of subsets of symbols, selecting a set of initial a priori values of the inner code demodulation for each subset of symbols, and demodulating each subset of symbols, using the initial a priori values of the subset of symbols and an inner code generator matrix, to generate a plurality of first soft information values. The instructions may further comprise associating each of the first soft information values with one of the plurality of information bits using an outer code generator matrix, calculating a plurality of second soft information values, wherein each second soft information value corresponds to one of the information bits and is calculated using at least two of the first soft information values associated with the information bit, determining a new set of a priori values of the inner code demodulation for each subset of symbols, using the second soft information values and the outer code generator matrix, and replacing the initial a priori values with the new a priori values, and repeating the demodulating, associating, calculating and determining actions at least once.

According to other aspects, a method of encoding a strip symbol for transmission to a wireless terminal in a wireless communication environment may comprise encoding an information bit vector with an outer code to generate a bit matrix using an outer code generator matrix generating a codeword for each row in the bit matrix using an inner code generator matrix, and concatenating the generated codewords into a single codeword. The method may further comprise mapping the concatenated codeword to a number of modulation symbols, and mapping the modulation symbols to a subset of tones in the strip symbol.

According to another aspect, an apparatus that facilitates encoding a strip symbol for transmission to a wireless terminal in a wireless communication environment may comprise an encoder that encodes an information bit vector with an outer code to generate a bit matrix using an outer code generator matrix, generates a codeword for each row in the bit matrix using an inner code generator matrix, concatenates the generated codewords into a single codeword. The apparatus may further comprise a processor that maps the concatenated codeword to a number of modulation symbols and maps the modulation symbols to a subset of tones in the strip symbol, and a transmitter that transmits the strip symbol.

Yet another aspect relates to an apparatus that facilitates encoding a strip symbol for transmission to a wireless terminal, comprising means for encoding an information bit vector with an outer code to generate a bit matrix using an outer code generator matrix, means for generating a codeword for each row in the bit matrix using an inner code generator matrix, as well as means for concatenating the generated codewords into a single codeword. The apparatus may additionally comprise means for mapping the concatenated codeword to a number of modulation symbols, and means for mapping the modulation symbols to a subset of tones in the strip symbol.

A further aspect relates to a computer-readable medium that stores computer-executable instructions for encoding an information bit vector with an outer code to generate a bit matrix using an outer code generator matrix, and generating a codeword for each row in the bit matrix using an inner code generator matrix. The instructions may further comprise concatenating the generated codewords into a single codeword, mapping the concatenated codeword to a number of modulation symbols, and mapping the modulation symbols to a subset of tones in the strip symbol.

According to still a further aspect, a processor that executes computer-executable instructions for encoding a strip symbol for transmission to a wireless device may execute instructions comprising encoding an information bit vector with an outer code to generate a bit matrix using an outer code generator matrix, generating a codeword for each row in the bit matrix using an inner code generator matrix, and concatenating the generated codewords into a single codeword. The processor may further execute instructions for mapping the concatenated codeword to a number of modulation symbols, and mapping the modulation symbols to a subset of tones in the strip symbol.

According to still other aspects, a method of permitting antenna switching in a wireless terminal in a wireless communication environment may comprise performing a coherent demodulation protocol during a second transmission time period of a first superslot and estimating an SNR for a first antenna, switching to at least a second antenna at the end of the first superslot, and receiving a bit-interleaved signal having information bits spread across a frequency spectrum for one or more strip symbols. The method may further comprise estimating an SNR for at least a second antenna during a first transmission time period of a subsequent super slot, performing a non-coherent detection protocol during SNR estimation for the at least second antenna, comparing the SNRs for each of the antennas, and selecting an antenna for the subsequent superslot as a function of the estimated SNRs.

According to another aspect, an apparatus that facilitates antenna switching in a wireless terminal may comprise a coherent demodulator that demodulates a signal received during a second transmission period of a first superslot, a receiver that receives a bit-interleaved signal having information bits spread across a frequency spectrum for one or more strip symbols, and a processor that estimates an SNR for a first antenna during the first superslot, switches to at least a second antenna at the end of the first superslot, and estimates an SNR for at least the second antenna during a first transmission period of a second superslot. The apparatus may further comprise a non-coherent demodulator that demodulates the strip channel during SNR estimation for the at least second antenna, wherein the processor compares the SNRs for each of the antennas and selects an antenna for the second superslot as a function of the estimated SNRs.

Another aspect relates to an apparatus that facilitates antenna switching in a wireless terminal in a wireless communication environment, comprising means for performing a coherent demodulation protocol during a second transmission time period of a first superslot and estimating an SNR for a first antenna, means for switching to at least a second antenna at the end of the first superslot, and means for receiving a bit-interleaved signal having information bits spread across a frequency spectrum for one or more strip symbols. The apparatus may additionally comprise means for estimating an SNR for at least a second antenna during a first transmission time period of a subsequent superslot, means for performing a non-coherent detection protocol during SNR estimation for the at least second antenna, means for comparing the SNRs for each of the antennas, and means for selecting an antenna for the second superslot as a function of the estimated SNRs.

Yet another aspect relates to a computer-readable medium having stored thereon computer-readable instructions for performing a coherent demodulation protocol during a first superslot and estimating an SNR for a first antenna, switching to a second antenna at the end of the first superslot, and receiving a bit-interleaved signal having information bits spread across a frequency spectrum for one or more strip symbols. The instructions may further comprise estimating an SNR for at least a second antenna during a first transmission time period of a subsequent superslot, performing a non-coherent detection protocol during SNR estimation for the at least second antenna, comparing the SNRs for each of the antennas, and selecting an antenna for a second transmission period of the subsequent superslot as a function of the estimated SNRs.

According to a further aspect, a processor that executes instructions for switching between multiple receive antennas in a wireless terminal may execute instructions comprising performing a coherent demodulation protocol during a second transmission time period of a first superslot and estimating an SNR for a first antenna, switching to at least a second antenna at the beginning of a first transmission time period of a subsequent superslot, receiving a bit-interleaved signal having information bits spread across a frequency spectrum for one or more strip symbols, and estimating an SNR for at least a second antenna during the first transmission time period of the subsequent superslot. The processor may further execute instructions for performing a non-coherent detection protocol during SNR estimation for the at least second antenna, comparing the SNRs for each of the antennas, and selecting an antenna for a second transmission period of the subsequent superslot as a function of the estimated SNRs.

To the accomplishment of the foregoing and related ends, certain illustrative aspects are described herein in connection with the following description and the annexed drawings. These aspects are indicative, however, of but a few of the various ways in which the principles of the claimed subject matter may be employed and the claimed subject matter is intended to include all such aspects and their equivalents. Other advantages and novel features may become apparent from the following detailed description when considered in conjunction with the drawings.

DETAILED DESCRIPTION

Figure 1:
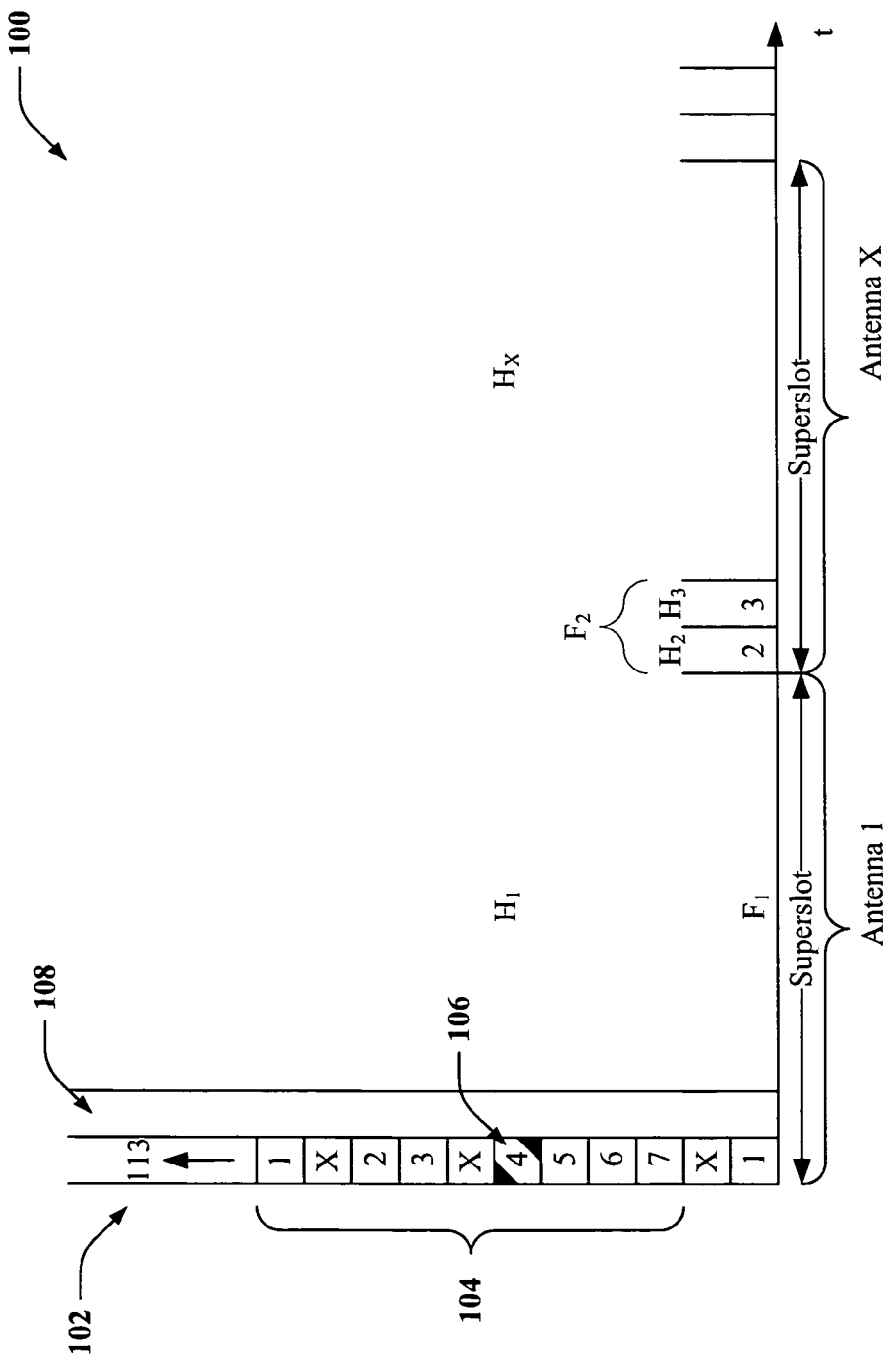
FIG. 1 illustrates a transmission channel overview with respect to time that facilitates to facilitate understanding of strip symbol structure and wireless terminal antenna analysis, in accordance with one or more aspects described herein.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that such subject matter may be practiced without these specific details. In other instances, well-known structures and devices are shown in block diagram form in order to facilitate describing the claimed subject matter.

Furthermore, various aspects are described herein in connection with a user device. A user device can also be called a system, a subscriber unit, subscriber station, mobile station, mobile device, remote station, remote terminal, access terminal, user terminal, terminal, user agent, or user equipment. A user device can be a cellular telephone, a cordless telephone, a Session Initiation Protocol (SIP) phone, a wireless local loop (WLL) station, a PDA, a handheld device having wireless connection capability, or other processing device connected to a wireless modem.

Moreover, aspects of the claimed subject matter may be implemented as a method, apparatus, or article of manufacture using standard programming and/or engineering techniques to produce software, firmware, hardware, or any combination thereof to control a computer or computing components to implement various aspects of the claimed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving voice mail or in accessing a network such as a cellular network. Of course, those skilled in the art will recognize many modifications may be made to this configuration without departing from the scope or spirit of what is described herein.

Various aspects described herein relate to coding and modulation to improve frequency diversity in a wireless communication environment, such as an orthogonal frequency division multiplexing communication environment. For instance, information bits may be spread across a bandwidth spectrum through a bit-interleaving protocol, and coding and modulation may be performed to facilitate performing a non-coherent demodulation protocol at a receiver, thereby mitigating a need for channel state information. Soft demodulation techniques may be utilized in conjunction with concatenated code t permit a wireless terminal to switch between antennas when a strip channel is received through multiple antennas.

FIG. 1 illustrates a transmission channel overview 100 with respect to time that facilitates the understanding of strip symbol structure and wireless terminal antenna analysis, in accordance with one or more aspects described herein. The transmission channel 100 comprises a strip symbol 102, which may comprise, for example, 113 tones, 56 of which may be utilized to transmit data, training information etc., and have a non-zero energy associated with them, while the remaining tones are zero energy tones, known as null tones, that do not carry any signal transmission energy. In some embodiments, the tones may be divided into a plurality of (e.g., eight) tone subsets, for example tone set 104. Each tone set includes 7 non-zero energy tones and possibly null tones. In each tone subset, the 7 non-zero energy tones may be interspersed with null tones. As illustrated, strip symbol 102 comprises 113 tones, and a tone subset 104 includes non-zero energy tones, numbered 1-7 and interspersed with null tones (labeled as "X"). In some embodiments, each tone subset 104 may comprise a training tone 106 on which a known symbol is transmitted to facilitate channel estimation. Training tone 106 may be a tone with a different non-zero energy level than the other non-zero energy tones in tone subset 104, and may be consistent between tone sets and/or strip symbols (e.g., always tone 3, always to 5, etc.) or may vary between tone sets and/or strip symbols. According to an example, tone 4 may be a training tone in all tone subsets in all strip channels. According to another example, tone 3 may be a training tone in all tone sets in a first strip symbol, tone 4 may be a training tone in all tone subsets in a second strip symbol, yet another tone (e.g., any tone 1-7) may be a training tone in a third strip symbol, and so on. According to yet another example, training tones in different subsets may be randomly assigned and/or selected. Furthermore, any permutation of training tones, tone sets, and strip symbols may be implemented, so long as each tone set has a training symbol. According to some aspects, the training tone 106 is the middle tone among the 7 non-zero energy tones in the tone subset 104. Strip symbol 108 follows strip symbol 102. In some embodiments, the set of non-zero energy tones in strip symbol 102 is different from the set of non-zero energy tones in strip symbol 108.

Strip symbols 102 and 108 may be transmitted at the beginning portion of a superslot (e.g., approximately 11.4 milliseconds long). Consider a wireless terminal equipped with multiple antennas. In FIG. 1, a superslot includes a first time period in which the strip symbols are sent and a second time period in which the non-strip symbols are sent. For example, the first superslot of FIG. 1 includes strip symbols 102 and 108 as the first time period and the non-strip symbols in the remaining time period as the second time period.

Suppose that the second time period of the first superslot is received by a wireless terminal over a first channel, $H_1$, via a first antenna, Antenna 1. In one or more embodiments, a pilot signal is sent in the second time period of first superslot. The wireless terminal can thus estimate the channel H1 and use a coherent demodulation protocol, denoted as $F_1$, to decode the received signal. The wireless terminal may further evaluate the value of SNR for Antenna 1.

Then, in the first time period of the second superslot, the wireless terminal may switch to use different antennas, e.g., antenna 2 in the first strip symbol of the second superslot and antenna 3 in the second strip symbol of the second superslot, to receive the signal. As a result, the channel is changed to H2 and H3 in the first and second strip symbols respectively, as shown in FIG. 1. Note that channel H2 or H3 may be different from channel H1 due to the change of the receive antenna. Therefore, the channel estimation of H1 obtained in the first superslot may not be applicable for channel H2 or H3. Hence, the wireless terminal uses a non-coherent demodulation protocol, $F_2$, to decode the received signal in the strip symbols. The term "non-coherent" means that the modulation of the signal received in the strip symbols does not depend on the signal received in a preceding time period, e.g., in the second time period of the first superslot. The wireless terminal may further evaluate an SNR for one or more other antennas and/or channels (e.g., $H_2$, $H_3$, etc.) received thereby. SNRs may be measured, for instance, during the zero-energy tones (e.g., interference may be quantified) and null tones in each strip symbol. The SNRs for the one or more other antennas may be compared to the SNR for the first antenna, determined during the previous superslot, and the wireless terminal may switch to the antenna (Antenna X shown in FIG. 1) as a function of the comparison of the measured SNRs. For example, the wireless terminal may select the antenna of the highest measured SNR to be used in the second time period of the second superslot. The above procedure may repeat in the subsequent superslots to provide an iterative method by which antenna reception capability is continuously monitored and evaluated to enable a wireless terminal with multiple antennas to switch between them while utilizing a single receiver chain.

In accordance with some aspects, a three-antenna wireless terminal can receive a signal with two strip symbols 102 and 108 at the beginning of each superslot to permit non-coherent demodulation of two unused antennas at each superslot. According to this example, the wireless terminal uses one antenna to receive non-strip symbols in a superslot, uses coherent modulation to decode non-strip symbols, and measures the SNR. The wireless terminal may switch to the other two unused antennas during the strip symbols of the subsequent superslot and perform the non-coherent demodulation protocol on each strip symbol to decode the signal. The wireless terminal further determines the SNR for the respective antennas using the strip symbols. The wireless terminal then selects one antenna to use in the non-strip symbols in the subsequent superslot based on the measured SNRs of the three antennas. It will be appreciated that while FIG. 1 and the foregoing example relate to a 3-receive-antenna wireless terminal, more or fewer receive antennas may be utilized and a corresponding number of strip symbols may be encoded and transmitted by a base station and received by the wireless terminal to facilitate antenna switching.

Encoding and/or modulation of the strip symbols may occur in various manners in conjunction with one or more aspects. Decoding of the strip symbols need not rely on the use of preceding symbols. In some embodiments, the strip symbols may be encoded with a vector, low-density parity check (LDPC) encoding scheme. In particular, the input is a number of information bits, e.g., 60 bits, and the output is a number of coded bits, e.g., 288 bits. The 60-bit vector may be expanded into a 64-bit vector by adding four zeros at the end of the information vector, which may be denoted as $u=[u_{59}, u_{58}, \ldots, u_0]$, where $u_{59}$ is the most significant bit (MSB) and $u_0$ is the least significant bit (LSB). The expanded information vector may then be denoted as $u=[u_{59}, u_{58}, \ldots, u_0, 0, 0, 0, 0]$. A 304-bit codeword vector $x=[x_{303}, X_{302}, \ldots, x_0]$ may be formed from a vector LDPC codes with certain parity check matrix, where $x_{303}$ is the MSB and $x_0$ is the LSB. A 288-bit output vector may be obtained by shortening the codeword vector x. For instance, the 12 most significant bits in the codeword may be punctured so that the next 288 bits in the codeword become the output vector, and the remaining 4 LSBs are similarly punctured. The output vector is given as $y=[x_{291}, x_{290}, \ldots, x_4]$, and may be mapped to 288 modulation symbols using the BPSK modulation scheme.

The 288 modulation symbols are sent in 6 strip symbols, each for 48 modulation symbols. That is, of the 56 available non-zero energy tone-symbols in each strip symbol, 8 are training tone symbols (one per tone set), resulting in 48 tone-symbols to which modulation symbols may be mapped. In the aspect shown in FIG. 1, a strip symbol comprises 56 non-zero energy tones, which are divided into 8 tone subsets and each subset comprises 7 non-zero energy tones. In the set of 48 modulation symbols for a given strip symbol, the first 6 modulation symbols are sent in the first tone subset as follows: the first 3 modulation symbols are sent in the first 3 tones of the tone subset, the other 3 modulation symbols are sent in the last 3 tones of the tone subset, and a known modulation symbol is sent in the middle tone of the tone subset, which can be used by the wireless terminal as a training symbol to learn the channel. The known symbol may be transmitted as the same power as the remaining 6 modulation symbols, or at a higher power. Similarly, the next 6 modulation symbols are sent in the second tone subset, and so on.

In another aspect, the strip symbols may be encoded with a concatenated code. Specifically, one strip symbol is to encode an information bit vector $u=[u_0, u_1, u_2, u_3, u_4]$. First, an outer code is used to form a 21-bit vector. For example, the outer code can be described using a 7×3 matrix, such as:

TABLE 1

$$u_{21} = \begin{bmatrix} u0 & u2 & u4 \\ u1 & u3 & u4 \\ u0 & u1 & u4 \\ u1 & u2 & u3 \\ u0 & u2 & u3 \\ u1 & u3 & u4 \\ u0 & u2 & u4 \end{bmatrix}$$

Each row comprises 3 bits. For each row in the matrix, an 8-bit codeword may be generated using an inner code generator matrix, $G_{3,8}$, such as: 11110000,11001100,10101010. For instance, the first row of the 7×3 matrix is $[u_0, u_2, u_4]$, and, therefore, the 8-bit codeword is equal to $[u_0, u_2, u_4]\, G_{3,8}$. A total of seven 8-bit codewords may be concatenated to form a 56-bit codeword, where the 8 MSBs are generated from the first row of the 7×3 matrix, the next 8 MSBs are generated from the second row, and so on. The 56-bit concatenated codeword may then be mapped to 56 modulation symbols, e.g., using the BPSK modulation scheme. The 56 modulation symbols are sent in the non-zero energy tones of a strip symbol respectively. Note that in order to achieve frequency diversity, the outer code ensures that any information bit ($u_0$, $u_1$, $u_2$, $u_3$, $u_4$) appears in multiple rows, which will then be encoded by multiple inner codewords. For example, $u_0$ appears in the first, third, fifth, and seventh rows. Those codewords will be mapped to tones spanning a wide frequency range in the strip symbol.

In another example, an information vector may be denoted as $u=[u_0, u_1, \ldots, u_{13}]$. First, an outer code is used to form a 21-bit vector. For example, the outer code can be described using a 7×3 matrix, such as:

TABLE 2

$$u_{42} = \begin{bmatrix} u5 & u1 & u12 \\ u5 & u2 & u0 \\ u2 & u3 & u1 \\ u3 & u10 & u4 \\ u8 & u5 & u6 \\ u0 & u10 & u7 \\ u3 & u7 & u11 \\ u7 & u4 & u8 \\ u8 & u9 & u2 \\ u9 & u4 & u12 \\ u10 & u11 & u6 \\ u11 & u9 & u13 \\ u12 & u13 & u6 \\ u13 & u0 & u1 \end{bmatrix}$$

Each row comprises 3 bits. For each row in the matrix, an 8-bit codeword may be generated using an inner code generator matrix, $G_{3,8}$, such as: 11110000,11001100,10101010. For instance, the first row of the 14×3 matrix is $[u_5, u_1, u_{12}]$, and, therefore, the 8-bit codeword is equal to $[u_5, u_1, u_{12}]\, G_{3,8}$. A total of fourteen 8-bit codewords may be concatenated to form a 112-bit codeword, where the 8 MSBs are generated from the first row of the 14×3 matrix, the next 8 MSBs are generated from the second row, and so on. The 112-bit concatenated codeword may then be mapped to 112 modulation symbols, e.g., using the BPSK modulation scheme. The 112 modulation symbols are sent in the non-zero energy tones of two strip symbols respectively.

Figure 2:
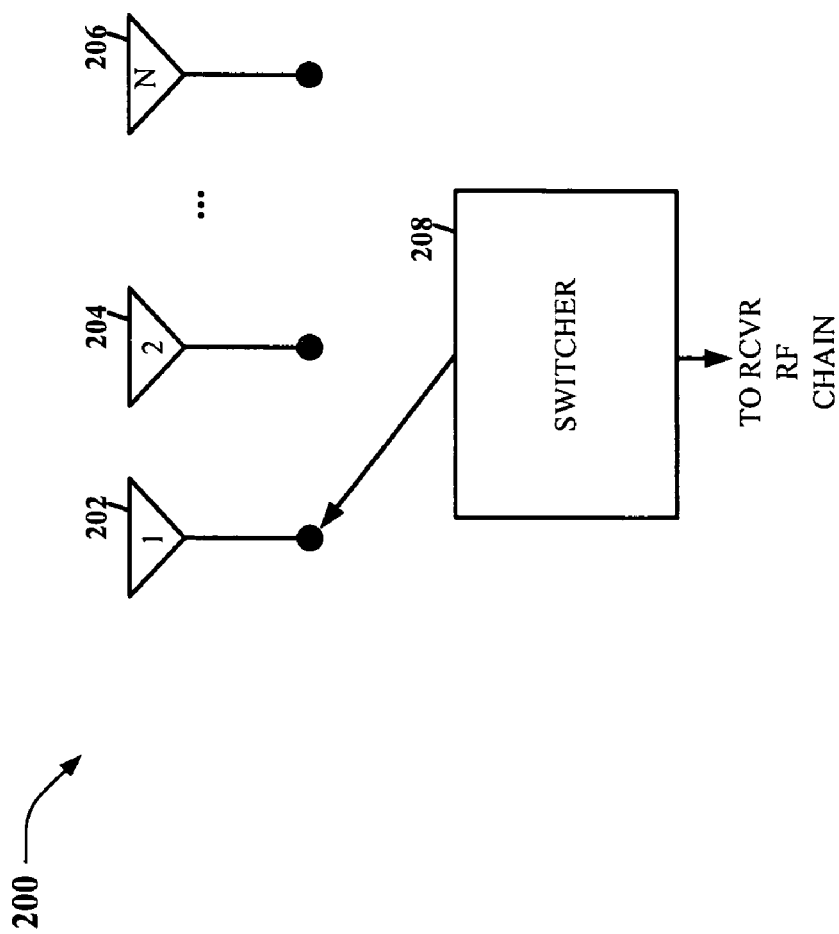
FIG. 2 illustrates a system comprising components in an exemplary wireless terminal comprising a receiver RF chain, in accordance with various aspects presented herein.

FIG. 2 illustrates a system 200 comprising components in an exemplary wireless terminal comprising a receiver RF chain, in accordance with various aspects presented herein. System 200 utilizes a switcher 208 to select one out of the plurality of N antenna elements (202, 204, 206). Received signals are routed through the selected antenna to the RF receiver chain, while received signals on the other, non-selected, antennas are not forwarded. Switcher 208 is shown coupled to a first antenna 202. The switcher may be controlled to switch between antennas based on various information, including time period boundaries. This aspect may be viewed from a functional equivalency standpoint in that the switcher 208 may comprise a set of controllable gain elements (not shown) in which one value is set equal to one, corresponding to the selected antenna, and the other values are set equal to zero, corresponding to the other antennas.

Figure 3:
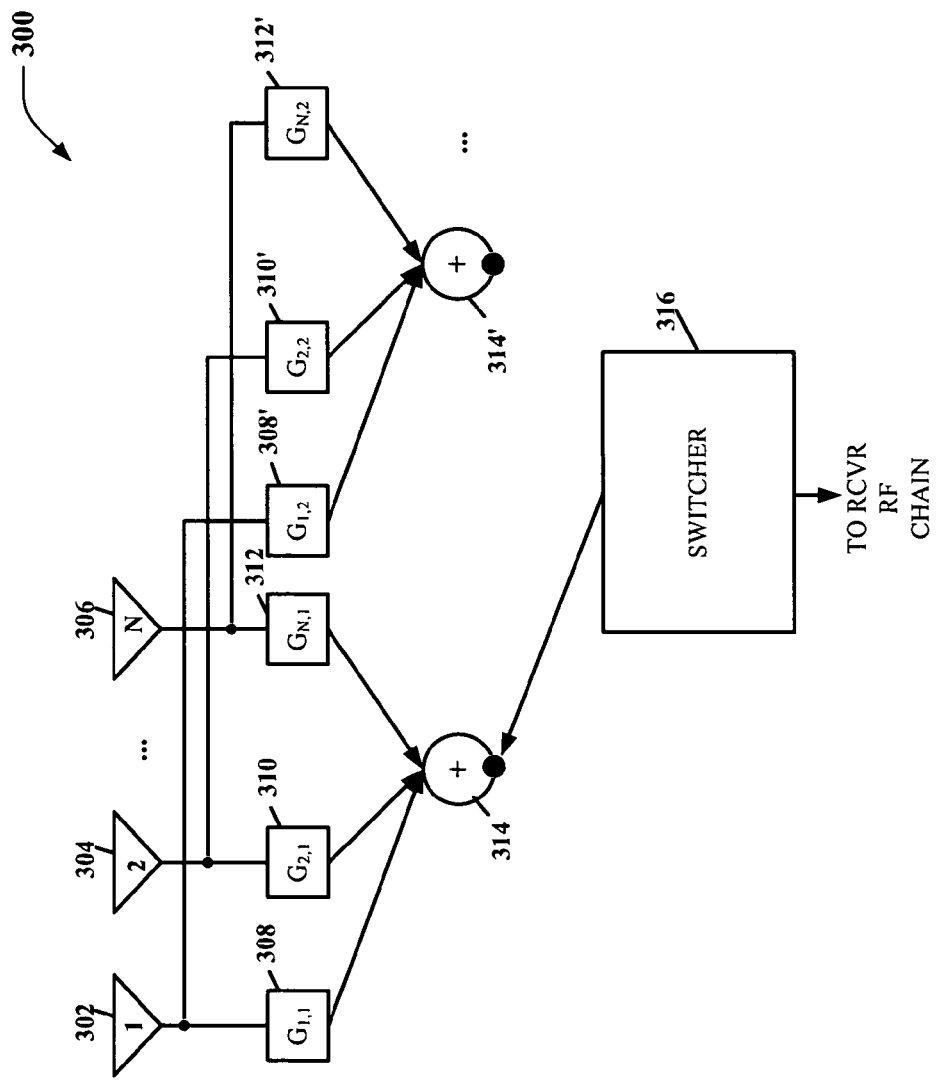
FIG. 3 illustrates a system with various components in a wireless terminal comprising a receiver RF chain, in accordance with various aspects presented herein.

FIG. 3 illustrates a system 300 with various components in a wireless terminal comprising a receiver RF chain, in accordance with various aspects presented herein. According to some aspects, multiple "compound" antenna patterns are possible. For instance, system 300 includes a plurality of antenna elements (302, 304, 306) coupled to a first set of gain elements (308, 310, 312), with gain values (G1,1, G2,1, GN,1), respectively. The output of the first set of gain elements (308, 310, 312) is input to a first combining circuit 314. Antenna elements (302, 304, 306) are also coupled to a second set of gain elements (308', 310', 312), with gain values (G1,2, G2,2, GN,2), respectively. The output of the second set of gain elements (308', 310', 312') is input to a second combining circuit 314'. Additional sets of gain elements each with a corresponding combining circuit may be implemented. System 300 also includes a switcher 316 which couples one of the outputs of one of the combining circuits (314, 314') to itself and is coupled to the receiver's RF chain input.

Each antenna pattern is in effect created by the weighted sum of the N antenna elements. Different antenna patterns differ in their weighing coefficients, gain values of the a set of gain elements, e.g., (G1,1, G2,1, . . . , GN,1), (GN,1, G1, 2, . . . , GN,2). The weighting coefficients, sometimes referred to a gain values, can be complex or real values. The gain values may be fixed, predetermined or programmable, adjustable, etc.

Figure 4:
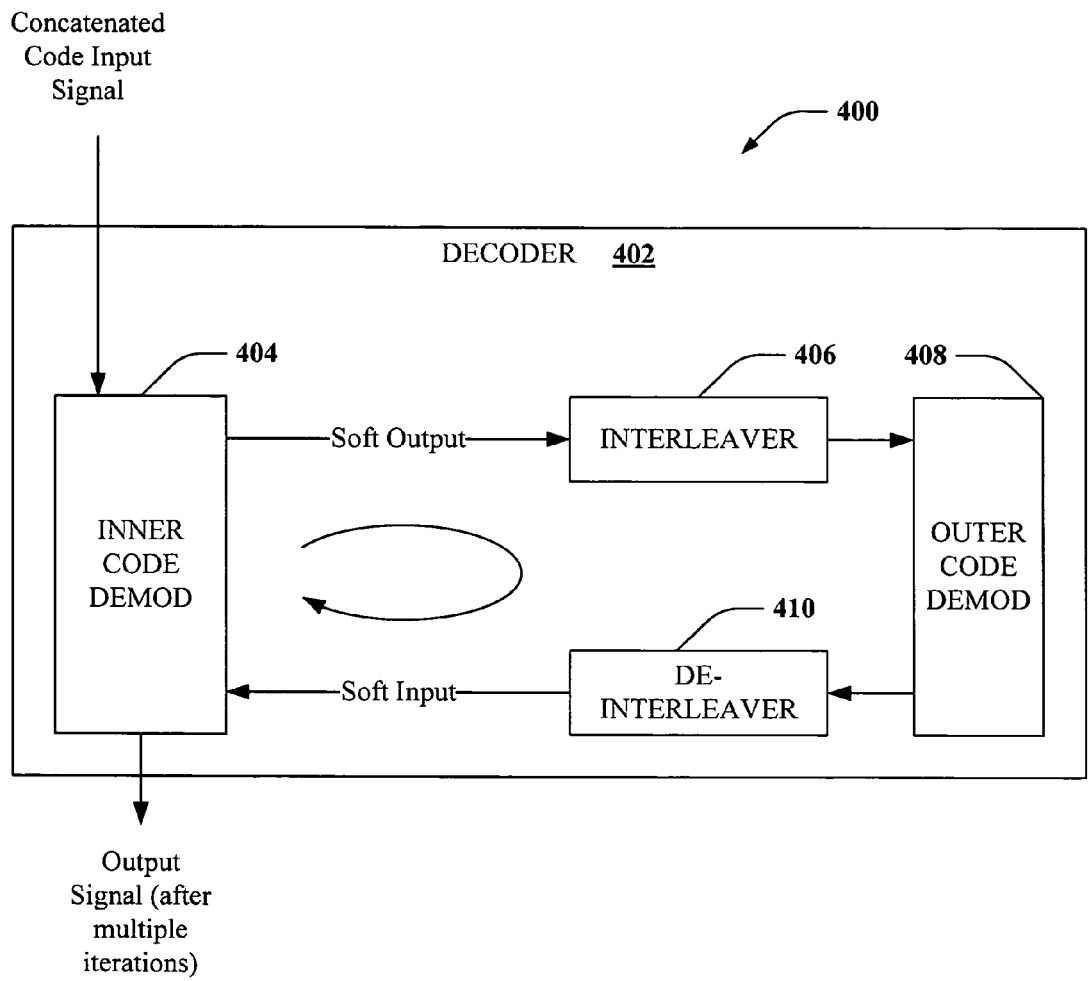
FIG. 4 is an illustration of a system that facilitates performing multiple iterations of a soft demodulation and interleaving protocol to refine a received signal and permit antenna switching in a wireless device with multiple antennas and a single receiver chain, in accordance with one or more aspects.

FIG. 4 is an illustration of a system 400 that facilitates performing multiple iterations of a soft demodulation and interleaving protocol to decode a received signal in a non-coherent manner, in accordance with one or more aspects. The signal is encoded with a concatenated code as illustrated in the embodiments of Table 1 and Table 2.

For the concatenated code, it is possible to formulate the overall generator matrix and to derive the optimal, e.g., maximal likelihood, decoding algorithm. However, the optimal decoding algorithm may be computationally complex. The iterative decoder 402 takes advantage of the concatenated coding structure and can approach the performance of the optimal decoder with a few iterations. Advantageously, the complexity is significantly reduced.

The decoder 402 may receive a concatenated code input signal, for example a strip symbol received in a superslot as described with regard to Table 1 or 2 in FIG. 1, and may initiate a soft-input soft-output demodulation protocol that utilizes an inner code demodulator 404, an interleaver 406, an outer code demodulator 408, and a de-interleaver 410. For example, a set of symbols containing a plurality of information bits may be received by inner code demodulator 404, which may then divide the received symbol set into a plurality of symbol subsets. Decoder 402 may select a plurality of a priori values for inner code demodulation of the symbol subsets, and inner code demodulator 404 may demodulate the symbol subsets using the a priori values and an inner code generator matrix to generate a plurality of soft information output values. The soft information output values may be interleaved by interleaver 406 and associated with one of the plurality of information bits by outer code modulator 408 (e.g., using an outer code generator matrix). De-interleaver 410 may calculate a plurality of second soft information values as an output of the outer code demodulator 408, where each second soft information value corresponds to one of the information bits and is calculated using at least two of the first soft information values associated with the information bit. The second soft information values may then be utilized to determine a new set of a priori values for use in a next iteration of the inner code demodulation of the received input symbols, and so on, as indicated by the circular arrow in FIG. 4.

Consider Table 1 as an example. First, the received signal may be demodulated for the inner code, whose generator matrix may be given as $G_{3,8}$, to generate the soft decoding values of each row in Table 1, in particular, the soft values X01, X21, X41 of $[u_0, u_2, u_4]$ of the first row, the soft values X12, X32, X42 of $[u_1, u_3, u_4]$ of the second row, and so on. Those soft values are called the output soft values of the inner code (e.g., the inner code demodulator 404).

The outer code demodulator 408 provides an additional coding protection for any given information bit. For example, note that for bit $u_0$ the first, third, fifth, and seventh rows all provide the soft values. Ideally those soft values are identical. However, because of interference and noise in the received signal, they may not be identical in the first round of iteration. The interleaver 406, outer code demodulator 408, and de-interleaver 410 take the output soft values of the inner code and calculate the output soft values of the outer code. For example, denote the output soft values of the inner code in the first, third, fifth, and seventh rows for bit $u_0$ to be X01, X03, X05 and X07 respectively. Then for bit $u_0$, the output soft value of the outer code for the first row, denoted as Y01 may be calculated from X01, X03, X05 and X07, e.g., Y01=average (X03, X05, X07). Similarly, for bit $u_0$, the output soft value of the outer code for the third row, denoted as Y03 may be calculated from X01, X03, X05 and X07, e.g., Y03=average (X01, X05, X07). In another example, one can set Y01 and Y03 to be the same, e.g., equal to average (X01, X03, X05, X07).

The output soft values of the outer code demodulator are then de-interleaved and provided back to the inner code demodulator 404 to improve the inner code demodulation. In particular, now the inner code demodulator 404 can take the original received signal and the de-interleaved output soft values of the outer code into account to generate the improved soft decoding values of each row. For example, in the first row, the inner code demodulator 404 uses the original received signal and Y01, Y21, Y41, and generates a new set of X01, X21, and X41. Here, Y01, Y21, Y41 are the output soft values of the outer code for bits $u_0, u_2, u_4$ of the first row respectively, and X01, X21, and X41 are the output soft values of the inner code for bits $u_0, u_2, u_4$ of the first row respectively. The above procedure repeats for all the other rows to generate a new set of the output soft values of the inner code. With the new output soft values of the inner code, the interleaver 406, outer code demodulator 408, and de-interleaver 410 can generate a new set of output soft values of the outer code. The above iterative procedure repeats until certain termination criterion is met.

Figure 5:
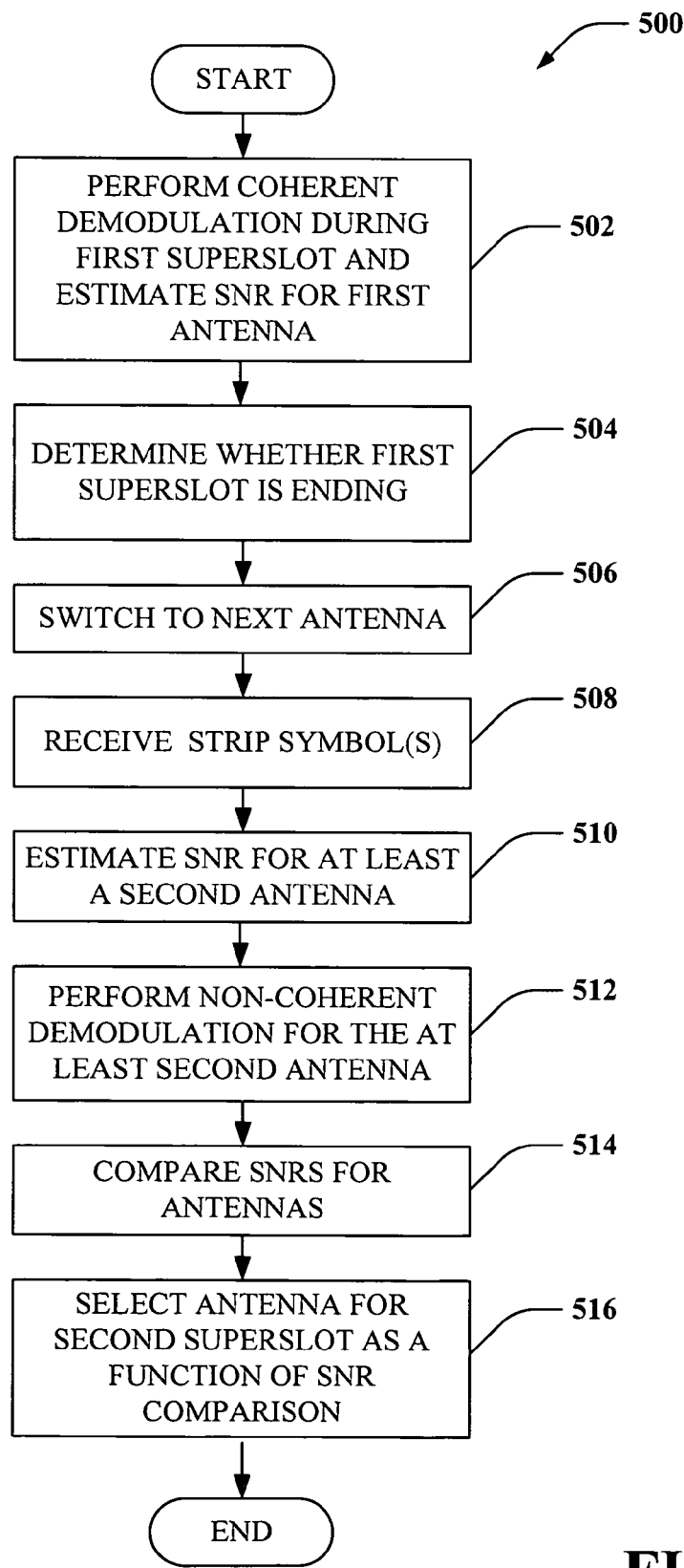
FIG. 5 is an illustration of a methodology for performing antenna switching in a wireless device with multiple receive antennas and a single receiver chain, in accordance with one or more aspects.
Figure 6:
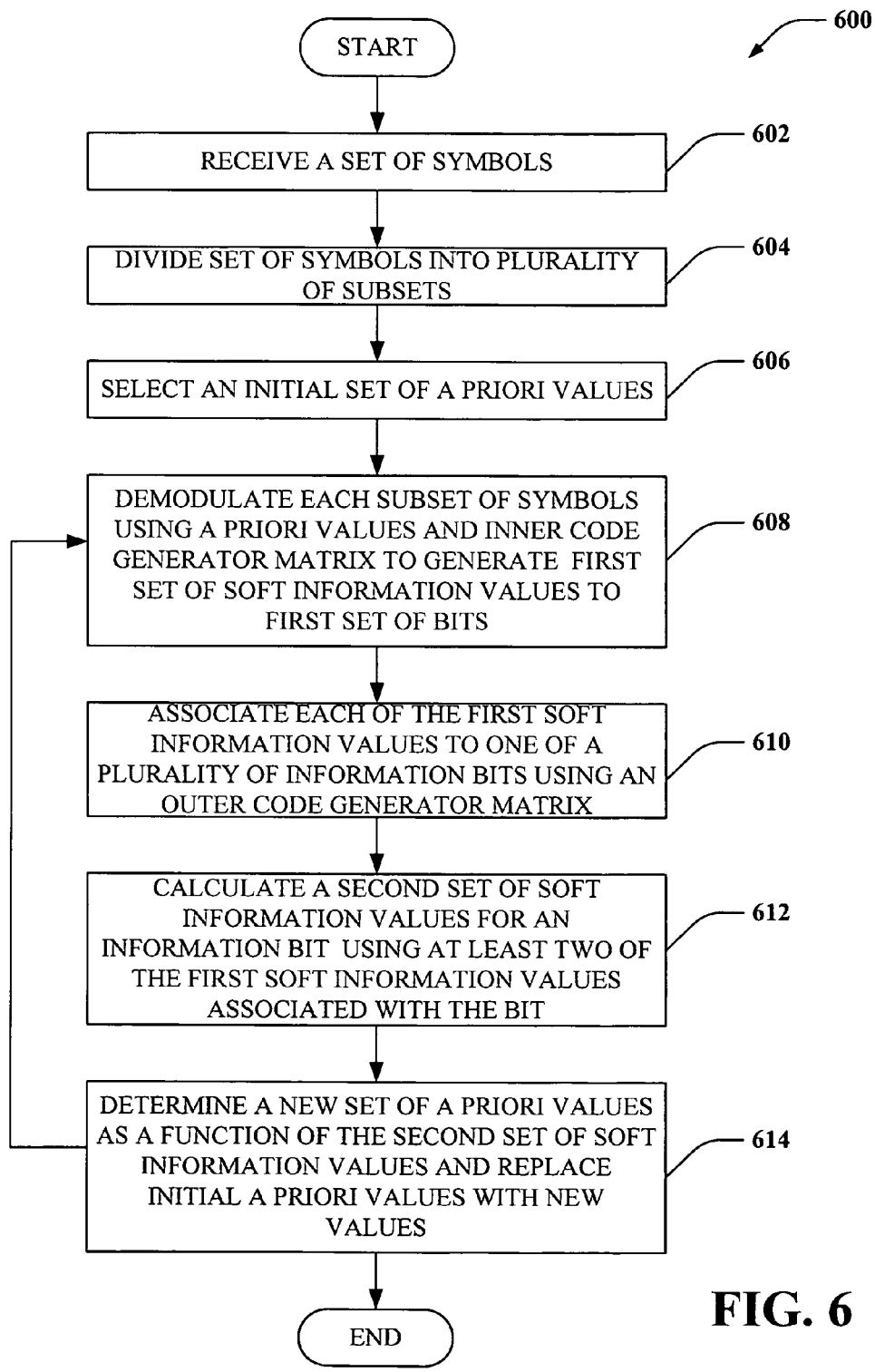
FIG. 6 illustrates a methodology for decoding a communication signal using an iterative SISO non-coherent demodulation protocol to demodulate and interleave concatenated code, in accordance with one or more aspects.
Figure 7:
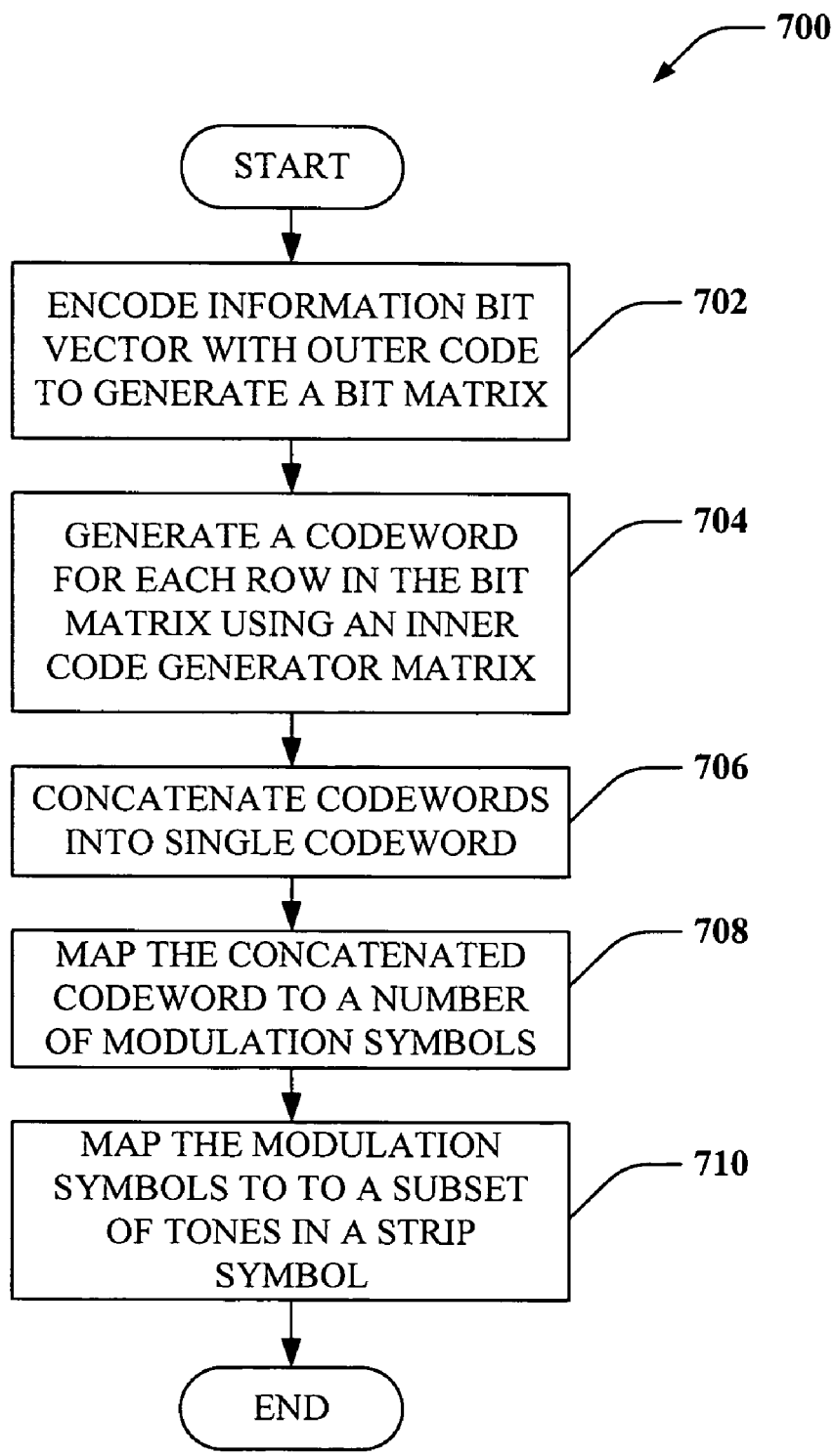
FIG. 7 is an illustration of a methodology for encoding a communication signal comprising a strip symbol for transmission to a wireless terminal, in accordance with one or more aspects.

Referring to FIGS. 5-7, methodologies relating to performing an iterative SISO non-coherent demodulation protocol upon a received concatenated code signal to facilitate antenna switching in a wireless terminal are illustrated. While, for purposes of simplicity of explanation, the methodologies are shown and described as a series of acts, it is to be understood and appreciated that the methodologies are not limited by the order of acts, as some acts may, in accordance with one or more embodiments, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be utilized to implement a methodology in accordance with the claimed subject matter.

FIG. 5 is an illustration of a methodology 500 for performing antenna switching in a wireless device with multiple receive antennas and a single receiver chain, in accordance with one or more aspects. For example, method 500 may facilitate performing various actions set forth above with regard to FIG. 1 in order to achieve antenna switching as described therein. At 502, a coherent demodulation protocol may be performed during a second transmission period of a first superslot and an SNR for a first antenna may be estimated. For instance, a superslot may include a first time period in which strip symbols are sent and a second time period in which the non-strip symbols are sent. For example, the first superslot described above with regard to FIG. 1 includes strip symbols as the first time period and the non-strip symbols in the remaining time period as the second time period. According to an aspect, a pilot signal may be sent in the second time period of first superslot. The wireless terminal may thus estimate the channel H1 corresponding to the first antenna and use a coherent demodulation protocol, to decode the received signal. For example, the wireless device may receive a set of pilots and derive channel estimation, which enables the wireless device to perform coherent demodulation for the signal received in the second time period of the first superslot.

At 504, a determination whether the first superslot is complete and/or whether a first transmission time period of the second superslot is imminent, may be made. If the first superslot is complete, a switch from the first antenna to a second antenna may be made, at 506, to assess an SNR there for. In the first time period of the second superslot, the wireless terminal may switch to different antennas, e.g., antenna 2 in the first strip symbol of the second superslot and antenna 3 in the second strip symbol of the second superslot, to receive the signal. As a result, the channel is changed from H1 to H2 and H3 in the first and second strip symbols respectively, as shown above in FIG. 1. Note that channel H2 or H3 may be different from channel H1 due to the change of the receive antenna. Therefore, the channel estimation of H1 obtained in the first superslot may not be applicable for channel H2 or H3. Hence, the wireless terminal uses a non-coherent demodulation protocol to decode the received signal in the strip symbols. Thus, at 508, a signal, e.g., modulated with a non-coherent modulation scheme and having information bits spread across a frequency spectrum for one or more strip symbols, may be received. According to one example, the strip symbol(s) may comprise concatenated code, but is not limited thereto.

At 510, an SNR for at least a second antenna may be estimated during a first transmission time period of the second superslot. The first transmission time period of the second superslot may correspond to, for example, one or more strip symbol durations, such as the strip symbols illustrated at the beginning of the second superslot of FIG. 1. A non-coherent detection protocol may be performed in the first transmission time period of the second superslot, at 512. The non-coherent detection protocol uses only the signal received in the first transmission time period of the second superslot and does not use the signal received in any preceding time. The SNR is also estimated for the at least second antenna. The non-coherent detection protocol may be a protocol with interleaved/de-interleaved information bits as described with regard to FIG. 4, above. At 514, a comparison may be made between the SNR estimated for the first antenna during the coherent detection time period and the SNR(s) detected for the at least second antenna during the non-coherent SIS detection time period. Finally, at 516, a wireless terminal may switch to the antenna having the highest SNR based on the comparison at 514. In this manner, a wireless terminal may be permitted to switch between multiple receive antennas as often as every superslot (e.g., 11.4 ms).

According to a related aspect, antenna switching may be a function of a predetermined threshold difference between antenna SNRs. For instance, the difference of SNRs at 514 may be required to exceed some predefined threshold (e.g., 0.25 dB, 0.5 dB, 1 dB, etc.) in order to justify switching between antennas. According to an example, if the predefined threshold is 0.5 dB and the first antenna has an SNR of X dB as estimated at 502, then the SNR of a second antenna as estimated at 510 would have to meet or exceed X+0.5 dB to warrant switching from the first receive antenna to the second receive antenna.

FIG. 6 illustrates a methodology 600 for decoding a communication signal using an iterative SISO non-coherent demodulation protocol to demodulate and interleave concatenated code, in accordance with one or more aspects. For example, method 600 can facilitate iterative demodulation and interleaving of a received concatenated signal as described above with regard to FIG. 4. According to the method, a set of symbols containing a plurality of information bits may be received at 602. The received symbol set may contain a plurality of information bits, and may be divided into a plurality of symbol subsets, each of which corresponds to an input for an inner code demodulation protocol, at 604. A plurality of initial a priori values for inner code demodulation of the symbol subsets may be selected at 606. At 608, the symbol subsets may be demodulated using the initial a priori values and an inner code generator matrix to generate a plurality of first soft information values. Each of the first soft information values may be associated with one of the plurality of information bits by employing an outer code generator matrix, at 610. At 612, plurality of second soft information values may be calculated as an output of the outer code demodulation, where each second soft information value corresponds to one of the information bits and is calculated using at least two of the first soft information values associated with the information bit. At 614, the second soft information values may then be utilized to determine a new set of a priori values for use in a next iteration of the inner code demodulation of the received input symbols, where the initial a priori values are replaced by the new a priori values for a subsequent iteration of method 600, starting with demodulation at 608. In this manner, method 600 provides an iterative series of acts that may be performed on a received strip symbol (or channel) to effectively decode the strip symbol via a low-complexity and highly efficient non-coherent SISO protocol.

According to related aspects, the wireless terminal may receive a signal that has been encoded using a Reed-Muller encoding technique, and may perform method 600 on the received signal. Additionally, the concatenated code received by the wireless terminal may exhibit certain properties associated with such encoding techniques. For instance, the received signal may be encoded prior to receipt by the wireless terminal using an outer code in combination with an inner code comprising at least two subblocks. Thus, it will be appreciated that method 600 facilitates performing a decoding algorithm similar to that performed by decoder 402 of FIG. 4.

According to other aspects, the set of symbols received at 602 may be divided into at least two subsets at 604. Additionally, the inner code generator matrix employed for each subset may be the same or may be different from subset to subset. A second soft information value for a given information bit may be an average of two or more first soft information values associated with the bit.

FIG. 7 is an illustration of a methodology 700 for encoding a strip symbol to enable mobile antenna switching in a wireless communication environment, in accordance with various aspects. At 702, a bit information vector may be encoded using an outer code generator matrix to generate a bit matrix, which may comprise at least two rows and any suitable number of columns. At 704, a codeword may be generated for each row in the bit matrix by implementing an inner code generator matrix, which may comprise a Reed-Muller code but is not limited thereto. The inner code generator matrix may be the same for all rows in the bit matrix or may be different from row to row. At 706, the codewords generated at 704 may be concatenated into a single codeword. The concatenated codeword may be mapped to a number of modulation symbols, at 708. Modulation symbols may be mapped to a subset of tones in the strip channel at 710. The subset of tones to which modulation symbols are mapped may be predetermined. Additionally, strip symbol tones to which modulation symbols are not mapped may be transmitted at a zero-energy level when the strip symbol is transmitted. According to an example, approximately 20% or more of the tones in the strip symbol may be transmitted at a zero-energy level. In this manner, method 700 may be utilized to facilitate performing various encoding actions, such as those described above with regard to FIG. 1, and any and all such actions may be performed in conjunction with method 700.

Figure 8:
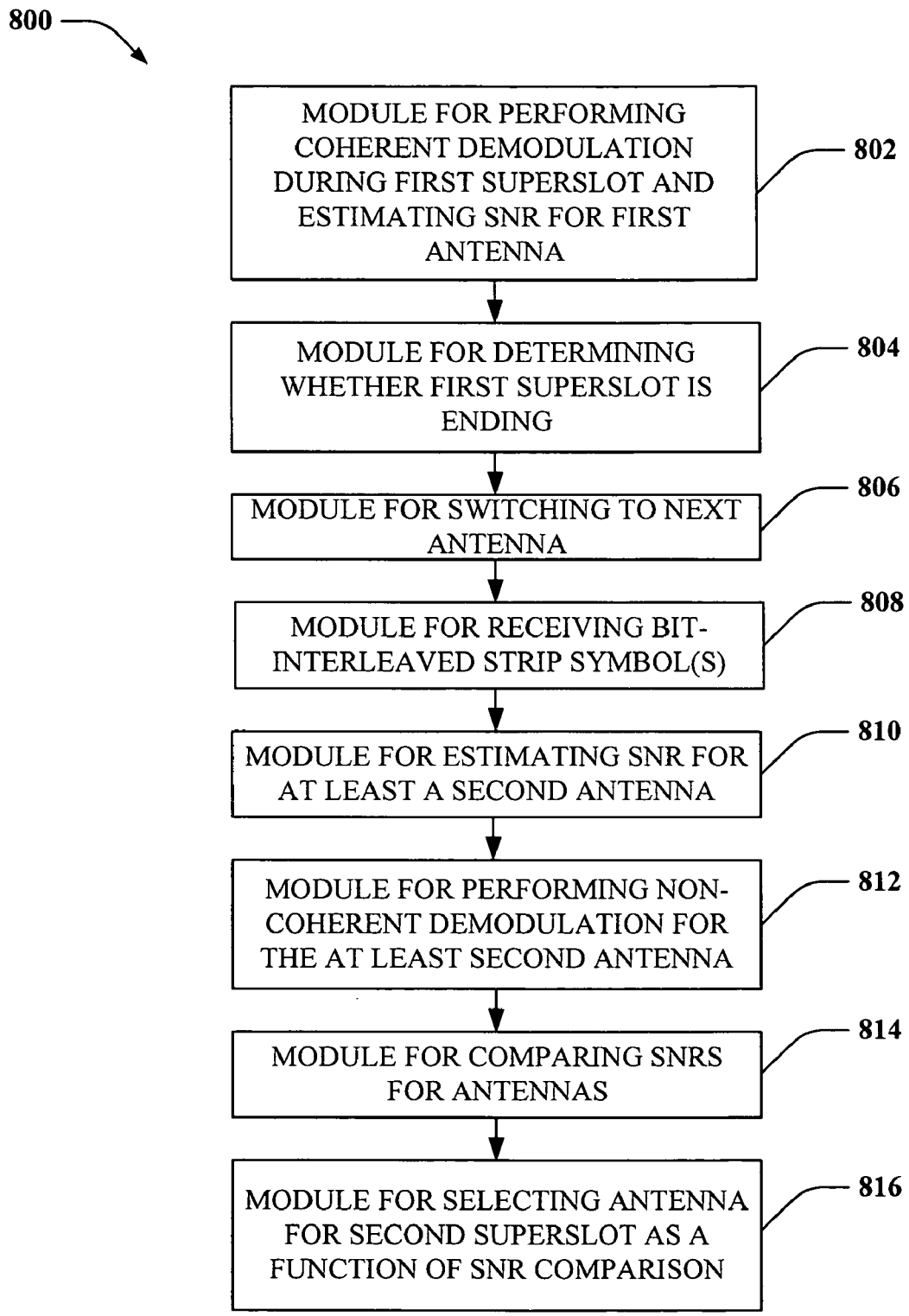
FIG. 8 illustrates a system that facilitates antenna switching in a wireless terminal with multiple receive antennas per receive chain, in a communication environment, in accordance with one or more aspects described herein.

FIG. 8 illustrates a system 800 that facilitates antenna switching in a wireless terminal with multiple receive antennas per receive chain, in a communication environment, in accordance with one or more aspects described herein. System 800 is represented as a series of interrelated functional blocks, which can represent functions implemented by a processor, software, or combination thereof (e.g., firmware). For example, system 800 may provide modules for performing various acts such as are described above with regard to FIG. 1. System 800 comprises a module for performing coherent demodulation 802 during first superslot and for estimating SNR for a first antenna. System 800 additionally comprises a module for determining whether a first superslot is ending 804 and a module for switching to a next (e.g. at least a second) antenna 806. System 800 further comprises a module for receiving bit-interleaved, concatenated strip symbol(s) 808, as well as a module for estimating SNR 810 for at least a second antenna and a module for performing non-coherent demodulation 812 for the at least second antenna. System 800 still further comprises a module for comparing SNRs 814 for antennas for which SNRs have been estimated, and a module for selecting an antenna 816 for receiving signal(s) during a subsequent superslot as a function of SNR comparison. It is to be understood that system 800 and the various a module comprised thereby may carryout the methods described above and/or may impart any necessary functionality to the various systems described herein.

Figure 9:
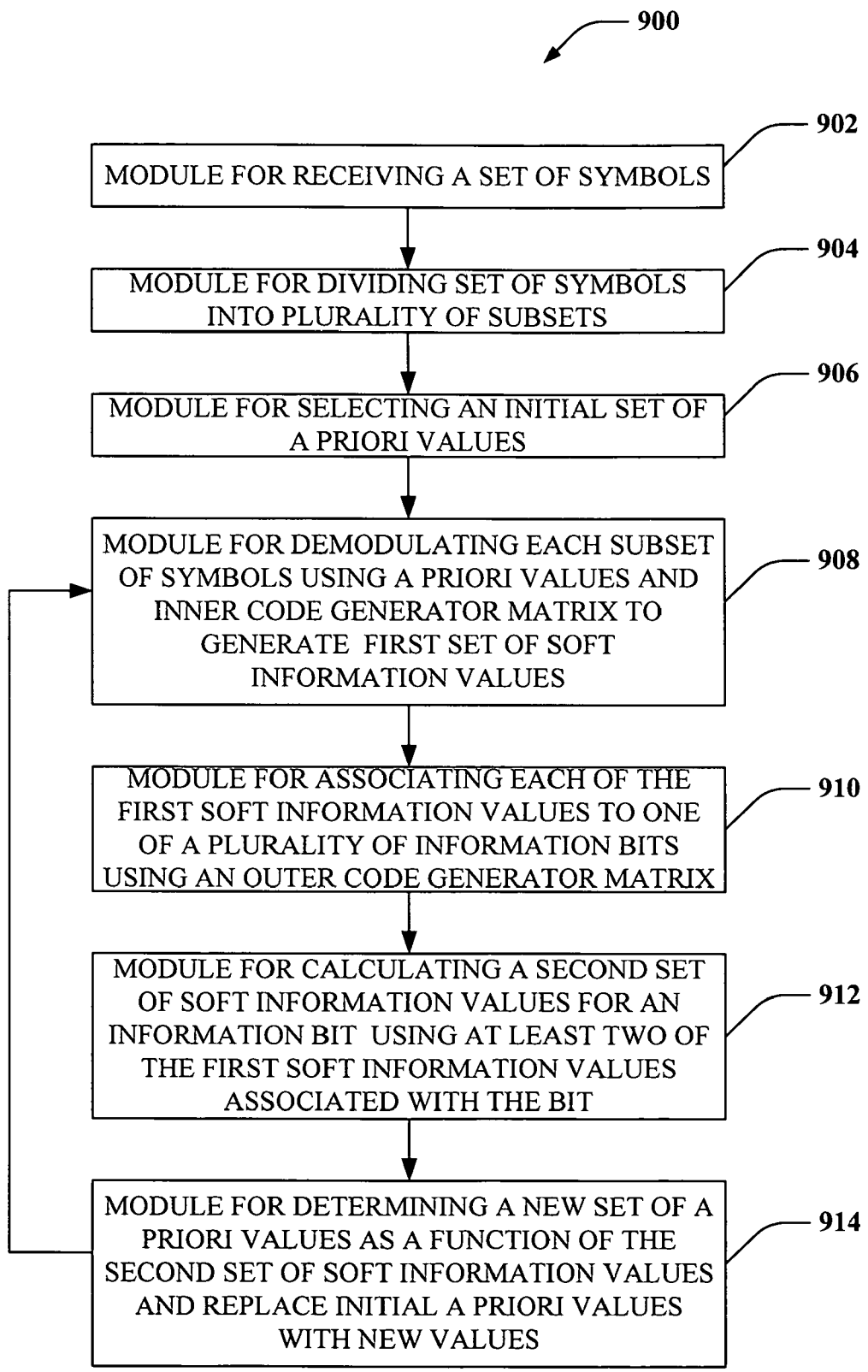
FIG. 9 illustrates a system that facilitates decoding concatenated-code signals received at a wireless terminal by performing an iterative soft-demodulation and interleaving algorithm, in accordance with various aspects.

FIG. 9 illustrates a system 900 that facilitates decoding concatenated-code signals received at a wireless terminal by performing an iterative soft-demodulation and interleaving algorithm, in accordance with various aspects. System 900 is represented as a series of interrelated functional blocks, which can represent functions implemented by a processor, software, or combination thereof (e.g., firmware). For example, system 900 may provide modules for performing various acts such as are described above with regard to FIG. 4. System 900 comprises a module for receiving 902 a set of symbols, which may have been encoded using a concatenated code, and a module 904 for dividing 904 the received set of symbols into a plurality of subsets. System 900 further comprises a module for selecting 906 an initial set of a priori values, which may be utilized by a module for demodulating 908, in conjunction with an inner code generator matrix, to generate a first set of soft information values. System 900 further comprises a module for associating 910 each of the first soft information values with one of the plurality of information bits contained in the received set of symbols using an outer code generator matrix. A module for calculating 912 may calculate a second set of soft information values for an information bit using at least two of the first soft information values associated with the bit. A module for determining 914 may then determine a new set of a priori values as a function of the second set of soft information values, which may replace the initial set of a priori values for a next iteration of demodulating, associating, calculating, and determining by respective modules 908, 910, 912, and 914. It is to be understood that system 900 and the various modules comprised thereby may carryout the methods described above and/or may impart any necessary functionality to the various systems described herein.

Figure 10:
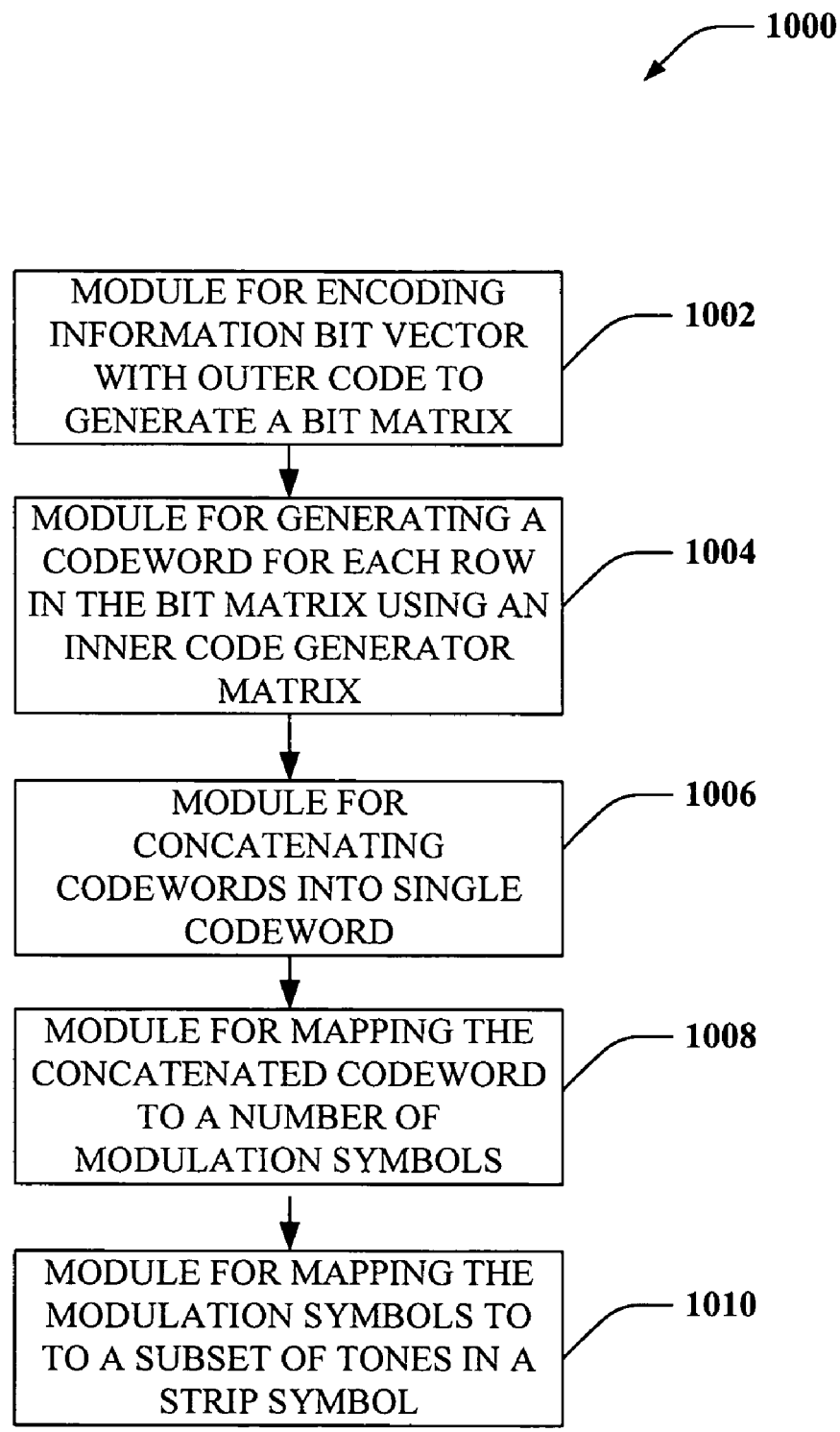
FIG. 10 is an illustration of a system that facilitates encoding a strip symbol in a transmission signal for a wireless terminal, in accordance with various aspects.

FIG. 10 illustrates a system that facilitates encoding a concatenated code strip symbol that enables antenna switching by a wireless terminal in a wireless communication environment, in accordance with one or more aspects. System 1000 is represented as a series of interrelated functional blocks, which can represent functions implemented by a processor, software, or combination thereof (e.g., firmware). For example, system 1000 may provide modules for performing various acts such as are described above with regard to FIG. 7. System 1000 comprises a module for encoding 1002 an information bit vector with an outer code to generate a bit matrix. System 1000 further comprises a module for generating 1004 a codeword for each row in the bit matrix using an inner code generator matrix. Additionally, system 1000 may comprise a module for concatenating 1006 codewords into a single codeword. A concatenated codeword may be mapped to a number of modulation symbols by a module for mapping a concatenated codeword 1008. Additionally, a module for mapping modulation symbols 1010 may map the modulation symbols to a subset of tones in the strip symbol. It is to be understood that system 1000 and the various modules comprised thereby may carryout the methods described above and/or may impart any necessary functionality to the various systems described herein.

Figure 11:
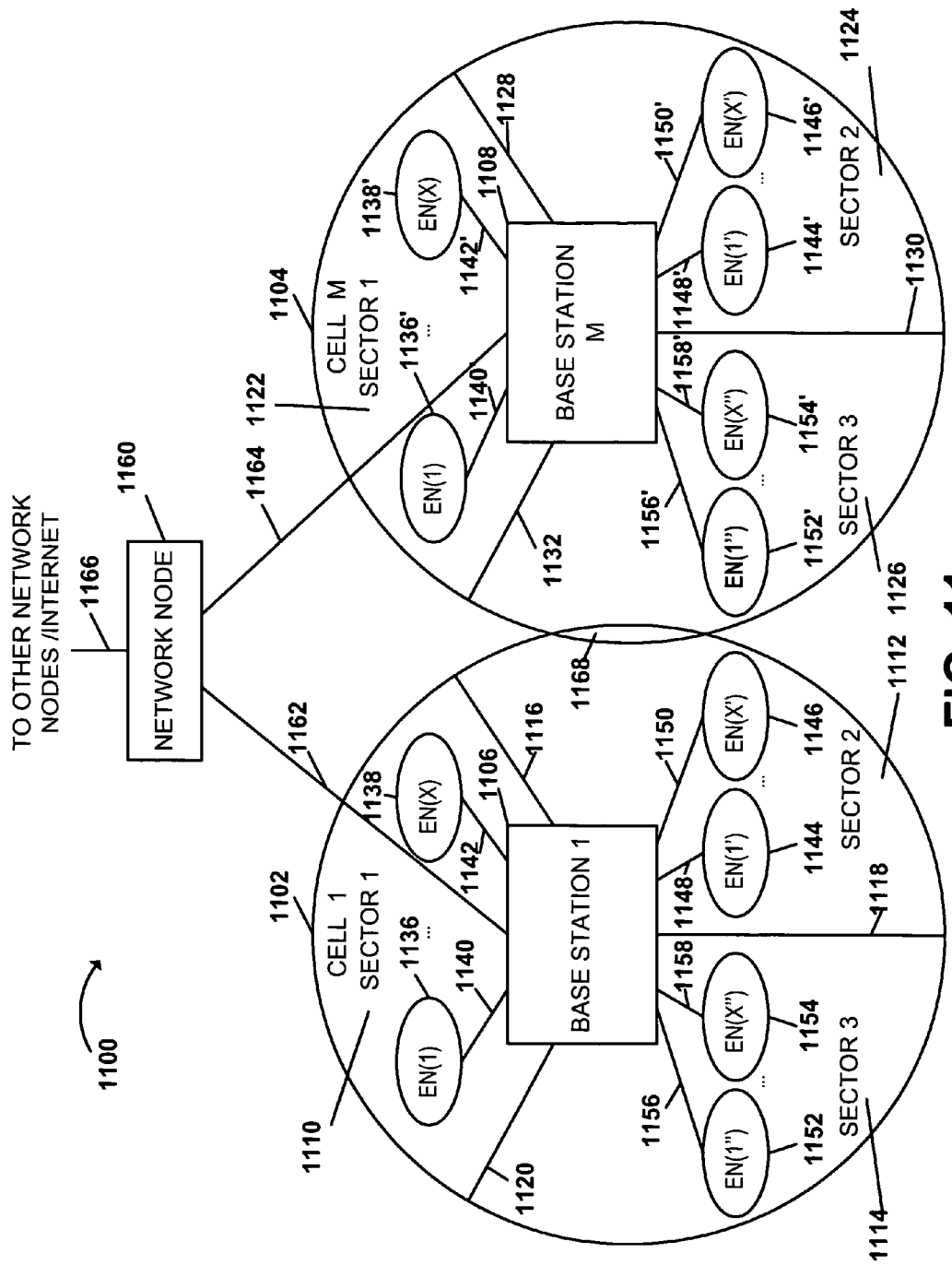
FIG. 11 illustrates a network diagram of an exemplary communications system implemented in accordance with the present invention.

FIG. 11 shows an exemplary communication system 1100 implemented in accordance with the present invention including multiple cells: cell 1 1102, cell M 1104. Note that neighboring cells 1102, 1104 overlap slightly, as indicated by cell boundary region 1168, thereby providing the potential for signal interference between signals being transmitted by base stations in neighboring cells. Each cell 1102, 1104 of exemplary system 1100 includes three sectors. Cells which have not be subdivided into multiple sectors (N=1), cells with two sectors (N=2) and cells with more than 3 sectors (N>3) are also possible in accordance with the invention. Cell 1102 includes a first sector, sector 1 1110, a second sector, sector 2 1112, and a third sector, sector 3 1114. Each sector 1110, 1112, 1114 has two sector boundary regions; each boundary region is shared between two adjacent sectors. Sector boundary regions provide the potential for signal interference between signals being transmitted by base stations in neighboring sectors. Line 1116 represents a sector boundary region between sector 1 1110 and sector 2 1112; line 1118 represents a sector boundary region between sector 2 1112 and sector 3 1114; line 1120 represents a sector boundary region between sector 3 1114 and sector 1 1110. Similarly, cell M 1104 includes a first sector, sector 1 1122, a second sector, sector 2 1124, and a third sector, sector 3 1126. Line 1128 represents a sector boundary region between sector 1 1122 and sector 2 1124; line 1130 represents a sector boundary region between sector 2 1124 and sector 3 1126; line 1132 represents a boundary region between sector 3 1126 and sector 1 1122. Cell 1 1102 includes a base station (BS), base station 1 1106, and a plurality of end nodes (ENs) in each sector 1110, 1112, 1114. Sector 1 1110 includes EN(1) 1136 and EN(X) 1138 coupled to BS 1106 via wireless links 1140, 1142, respectively; sector 2 1112 includes EN(1') 1144 and EN(X') 1146 coupled to BS 1106 via wireless links 1148, 1150, respectively; sector 3 1126 includes EN(1") 1152 and EN(X") 1154 coupled to BS 1106 via wireless links 1156, 1158, respectively. Similarly, cell M 1104 includes base station M 1108, and a plurality of end nodes (ENs) in each sector 1122, 1124, 1126. Sector 1 1122 includes EN(1) 1136' and EN(X) 1138' coupled to BS M 1108 via wireless links 1140', 1142', respectively; sector 2 1124 includes EN(1') 1144' and EN(X') 1146' coupled to BS M 1108 via wireless links 1148', 1150', respectively; sector 3 1126 includes EN(1") 1152' and EN(X") 1154' coupled to BS 1108 via wireless links 1156', 1158', respectively. System 1100 also includes a network node 1160 which is coupled to BS1 1106 and BS M 1108 via network links 1162, 1164, respectively. Network node 1160 is also coupled to other network nodes, e.g., other base stations, AAA server nodes, intermediate nodes, routers, etc. and the Internet via network link 1166. Network links 1162, 1164, 1166 may be, e.g., fiber optic cables. Each end node, e.g. EN 1 1136 may be a wireless terminal including a transmitter as well as a receiver. The wireless terminals, e.g., EN(1) 1136 may move through system 1100 and may communicate via wireless links with the base station in the cell in which the EN is currently located. The wireless terminals, (WTs), e.g. EN(1) 1136, may communicate with peer nodes, e.g., other WTs in system 1100 or outside system 1100 via a base station, e.g. BS 1106, and/or network node 1160. WTs, e.g., EN(1) 1136 may be mobile communications devices such as cell phones, personal data assistants with wireless modems, etc. Each base station performs tone subset allocation using a different method for the strip-symbol periods in accordance with the invention, from the method employed for allocating tones and determining tone hopping in the rest symbol periods, e.g., non strip-symbol periods. The wireless terminals use the tone subset allocation method of the present invention along with information received from the base station, e.g., base station slope ID, sector ID information, to determine the tones that they can use to receive data and information at specific strip-symbol periods. The tone subset allocation sequence is constructed, in accordance with the invention to spread the inter-sector and inter-cell interference across each of the tones.

Figure 12:
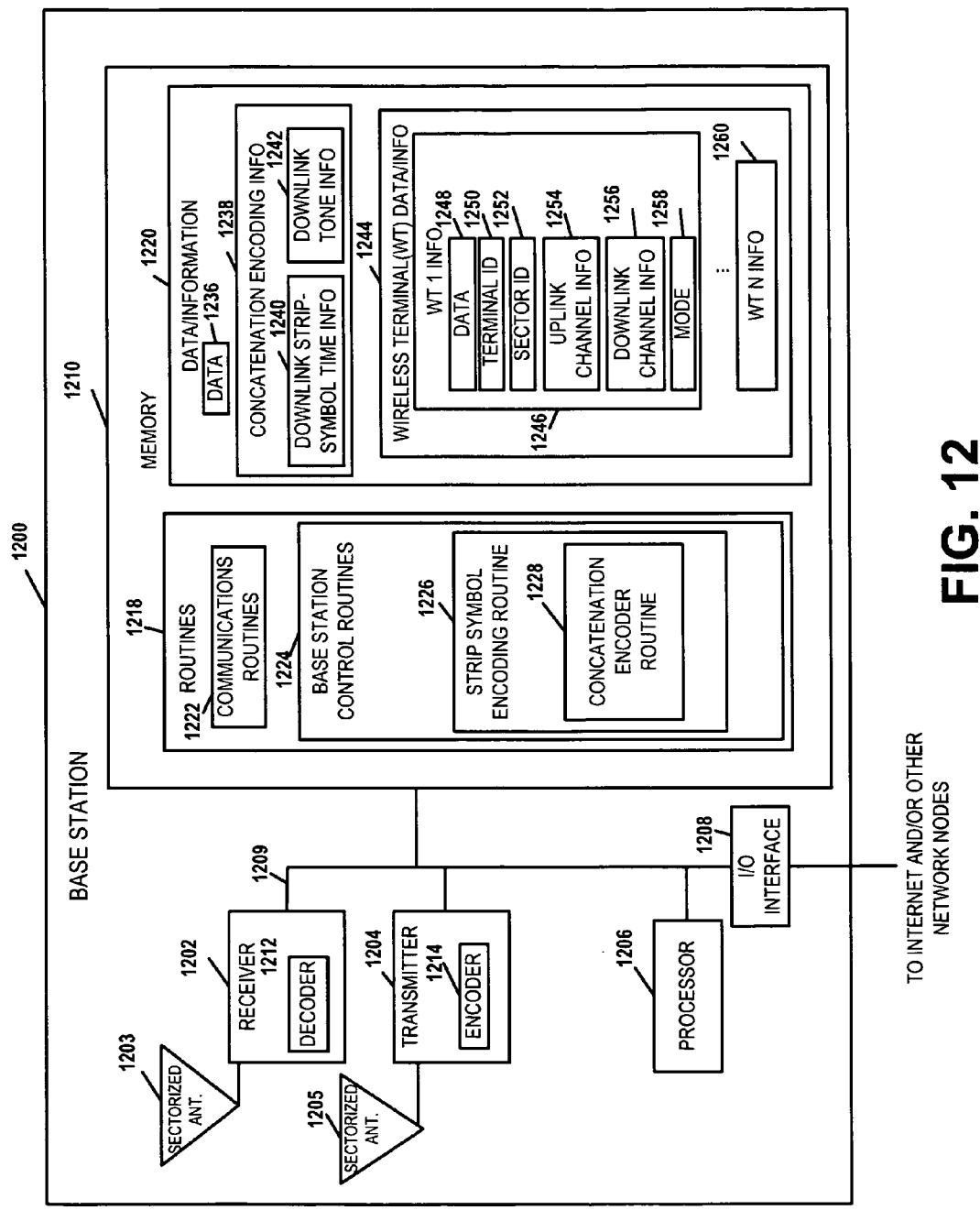
FIG. 12 illustrates an exemplary base station implemented in accordance with the present invention.

FIG. 12 illustrates an exemplary base station 1200 in accordance with the present invention. Exemplary base station 1200 implements the tone subset allocation sequences of the present invention, with different tone subset allocation sequences generated for each different sector type of the cell. The base station 1200 may be used as any one of the base stations 1126, 1128 of the system 1120 of FIG. 11. The base station 1200 includes a receiver 1202, a transmitter 1204, a processor 1206, e.g., CPU, an input/output interface 1208 and memory 1210 which are coupled together by a bus 1209 over which the various elements 1202, 1204, 1206, 1208, and 1210 may interchange data and information.

Sectorized antenna 1203 coupled to receiver 1202 is used for receiving data and other signals, e.g., channel reports, from wireless terminals transmissions from each sector within the base station's cell. Sectorized antenna 1205 coupled to transmitter 1204 is used for transmitting data and other signals, e.g., control signals, pilot signal, beacon signals, strip symbols in during a first transmission time period of a superslot, etc. to wireless terminals 1300 (see FIG. 13) within each sector of the base station's cell. In various embodiments of the invention, base station 1200 may employ multiple receivers 1202 and multiple transmitters 1204, e.g., an individual receivers 1202 for each sector and an individual transmitter 1204 for each sector. The processor 1206, may be, e.g., a general purpose central processing unit (CPU). Processor 1206 controls operation of the base station 1200 under direction of one or more routines 1218 stored in memory 1210 and implements the methods of the present invention. I/O interface 1208 provides a connection to other network nodes, coupling the BS 1200 to other base stations, access routers, AAA server nodes, etc., other networks, and the Internet. Memory 1210 includes routines 1218 and data/information 1220.

Data/information 1220 includes data 1236, concatenation encoding information 1238 including downlink strip-symbol time information 1240 and downlink tone information 1242, and wireless terminal (WT) data/info 1244 including a plurality of sets of WT information: WT 1 info 1246 and WT N info 1260. Each set of WT info, e.g., WT 1 info 1246 includes data 1248, terminal ID 1250, sector ID 1252, uplink channel information 1254, downlink channel information 1256, and mode information 1258.

Routines 1218 include communications routines 1222 and base station control routines 1224. Base station control routines 1224 includes a strip channel encoder routine, which may comprise a concatenation encoding routine 1228 that may be implemented by encoder 1214. The concatenation encoding routine 1228 may facilitate performing encoder actions similar to those described above with regard to FIG. 1.

Data 1236 includes data to be transmitted that will be sent to encoder 1214 of transmitter 1204 for encoding prior to transmission to WTs, and received data from WTs that has been processed through decoder 1212 of receiver 1202 following reception. Downlink strip-symbol time information 1240 includes the frame synchronization structure information, such as the superslot, beaconslot, and ultraslot structure information and information specifying whether a given symbol period is a strip-symbol period, and if so, the index of the strip-symbol period and whether the strip-symbol is a resetting point to truncate the tone subset allocation sequence used by the base station. Downlink tone information 1242 includes information including a carrier frequency assigned to the base station 1200, the number and frequency of tones, and the set of tone subsets to be allocated to the strip-symbol periods, and other cell and sector specific values such as slope, slope index and sector type.

Data 1248 may include data that WT1 1300 has received from a peer node, data that WT 1 1300 desires to be transmitted to a peer node, and downlink channel quality report feedback information. Terminal ID 1250 is a base station 1200 assigned ID that identifies WT 1 1300. Sector ID 1252 includes information identifying the sector in which WT1 1300 is operating. Sector ID 1252 can be used, for example, to determine the sector type. Uplink channel information 1254 includes information identifying channel segments for WT1 1300 to use, e.g., uplink traffic channel segments for data, dedicated uplink control channels for requests, power control, timing control, etc. Each uplink channel assigned to WT1 1300 includes one or more logical tones, each logical tone following an uplink hopping sequence in accordance with the present invention. Downlink channel information 1256 includes information identifying channel segments to carry data and/or information to WT1 1300, e.g., downlink traffic channel segments for user data. Each downlink channel assigned to WT1 1300 includes one or more logical tones, each following a downlink hopping sequence. Mode information 1258 includes information identifying the state of operation of WT1 1300, e.g. sleep, hold, on. Communications routines 1222 control the base station 1200 to perform various communications operations and implement various communications protocols. Base station control routines 1224 are used to control the base station 1200 to perform basic base station functional tasks, e.g., signal generation and reception, scheduling, and to implement the steps of the method of the present invention including transmitting signals to wireless terminals using the tone subset allocation sequences of the present invention during the strip-symbol periods.

Figure 13:
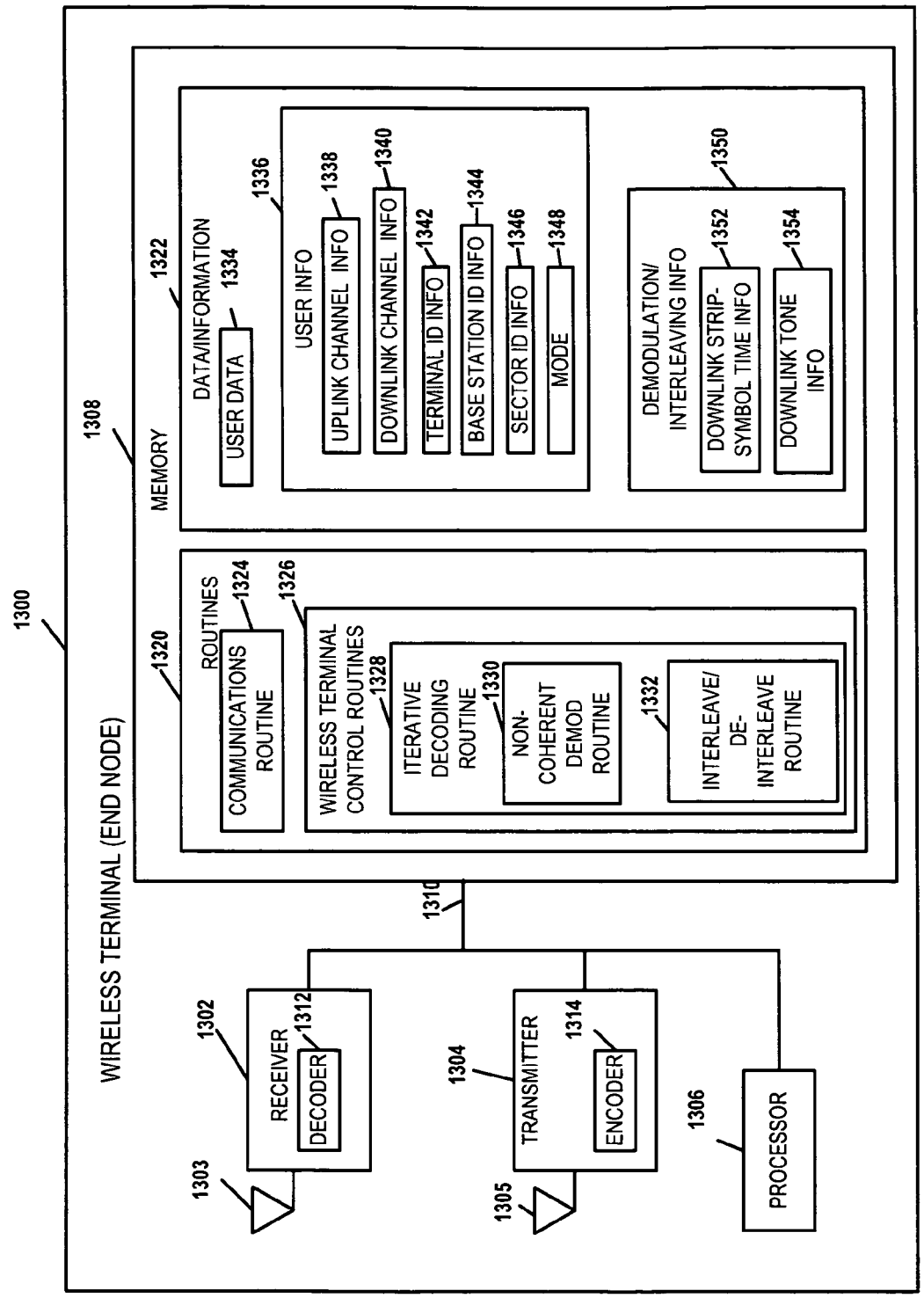
FIG. 13 illustrates an exemplary wireless terminal implemented in accordance with the present invention.

FIG. 13 illustrates an exemplary wireless terminal (end node) 1300 which can be used as any one of the wireless terminals (end nodes), e.g., EN(1) 1136, of the system 1100 shown in FIG. 11. Wireless terminal 1300 implements the tone subset allocation sequences, in accordance with the present invention. The wireless terminal 1300 includes a receiver 1302 including a decoder 1312 (e.g., which may be similar to the decoder 402 of FIG. 4), a transmitter 1304 including an encoder 1314, a processor 1306, and memory 1308 which are coupled together by a bus 1310 over which the various elements 1302, 1304, 1306, 1308 can interchange data and information. An antenna 1303 used for receiving signals from a base station 1200 is coupled to receiver 1302. An antenna 1305 used for transmitting signals, e.g., to base station 1200 is coupled to transmitter 1304.

The processor 1306, e.g., a CPU controls the operation of the wireless terminal 1300 and implements methods of the present invention by executing routines 1320 and using data/information 1322 in memory 1308. Data/information 1322 includes user data 1334, user information 1336, and demodulation/interleaving information 1350. User data 1334 may include data, intended for a peer node, which will be routed to encoder 1314 for encoding prior to transmission by transmitter 1304 to base station 1200, and data received from the base station 1200 which has been processed by the decoder 1312 in receiver 1302. User information 1336 includes uplink channel information 1338, downlink channel information 1340, terminal ID information 1342, base station ID information 1344, sector ID information 1346, and mode information 1348. Uplink channel information 1338 includes information identifying uplink channels segments that have been assigned by base station 1200 for wireless terminal 1300 to use when transmitting to the base station 1200. Uplink channels may include uplink traffic channels, dedicated uplink control channels, e.g., request channels, power control channels and timing control channels. Each uplink channel include one or more logic tones, each logical tone following an uplink tone hopping sequence in accordance with the present invention. The uplink hopping sequences are different between each sector type of a cell and between adjacent cells. Downlink channel information 1340 includes information identifying downlink channel segments that have been assigned by base station 1200 to WT 1300 for use when BS 1200 is transmitting data/information to WT 1300. Downlink channels may include downlink traffic channels and assignment channels, each downlink channel including one or more logical tone, each logical tone following a downlink hopping sequence, which is synchronized between each sector of the cell.

User info 1336 also includes terminal ID information 1342, which is a base station 1200 assigned identification, base station ID information 1344 which identifies the specific base station 1200 that WT has established communications with, and sector ID info 1346 which identifies the specific sector of the cell where WT 1300 is presently located. Base station ID 1344 provides a cell slope value and sector ID info 1346 provides a sector index type; the cell slope value and sector index type may be used to derive the uplink tone hopping sequences in accordance with the invention. Mode information 1348 also included in user info 1336 identifies whether the WT 1300 is in sleep mode, hold mode, or on mode.

Demodulation/interleaving information 1350 includes downlink strip-symbol time information 1352 and downlink tone information 1354. Downlink strip-symbol time information 1352 include the frame synchronization structure information, such as the superslot, beaconslot, and ultraslot structure information and information specifying whether a given symbol period is a strip-symbol period, and if so, the index of the strip-symbol period and whether the strip-symbol is a resetting point to truncate the tone subset allocation sequence used by the base station. Downlink tone info 1354 includes information including a carrier frequency assigned to the base station 1000, the number and frequency of tones, and the set of tone subsets to be allocated to the strip-symbol periods, and other cell and sector specific values such as slope, slope index and sector type.

Routines 1320 include communications routines 1324 and wireless terminal control routines 1326. Communications routines 1324 control the various communications protocols used by WT 1300. Wireless terminal control routines 1326 controls basic wireless terminal 1300 functionality including the control of the receiver 1302 and transmitter 1304. Wireless terminal control routines 1326 include an iterative decoding routine 1328. The iterative decoding routine 1328 includes a non-coherent demodulation routine 1330 for the strip-symbol periods and an interleaving/de-interleaving routine 1332 for that facilitates decoding a received strip symbol that has been encoded using a concatenated encoding technique.

Figure 14:
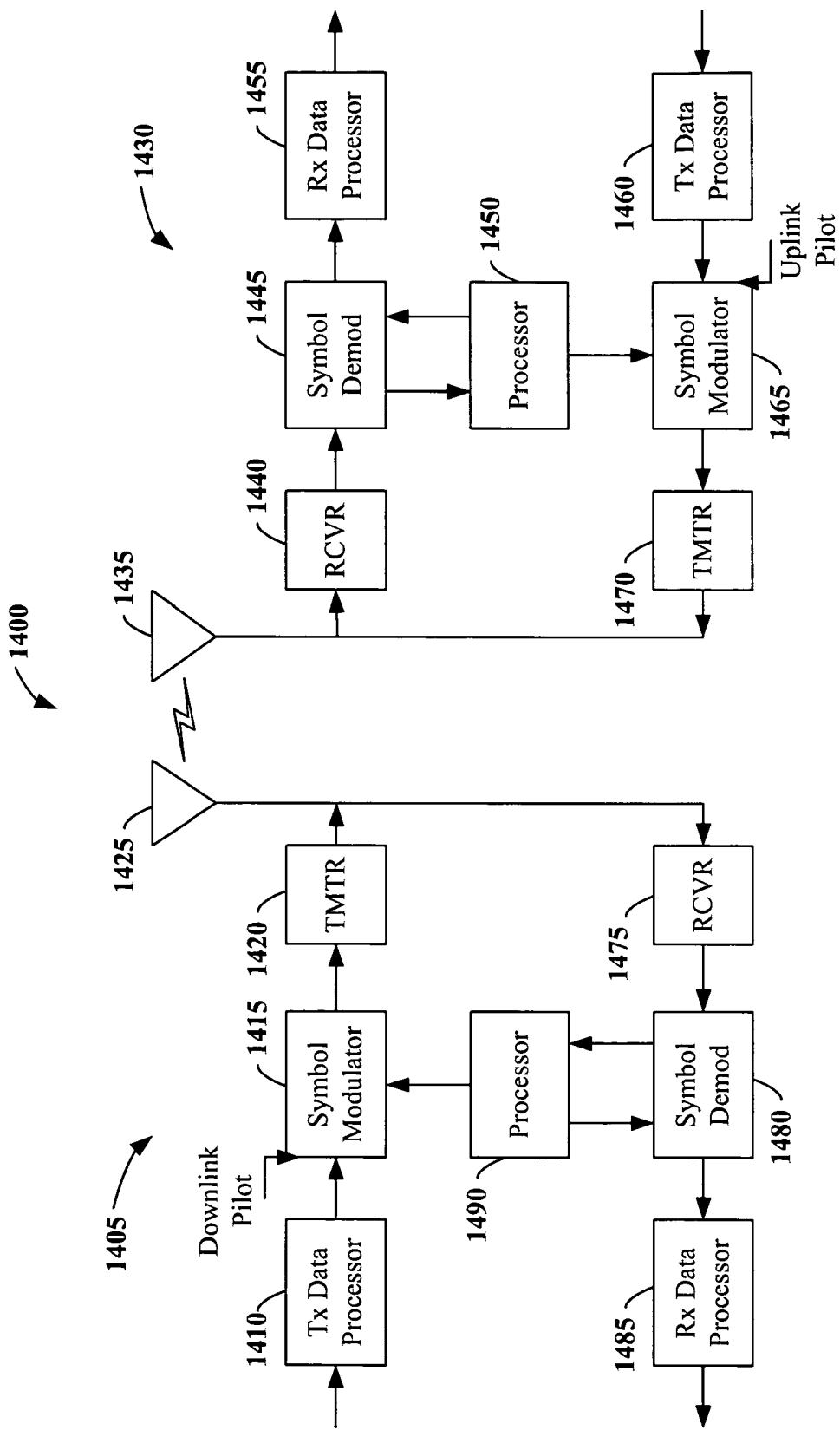
FIG. 14 is an illustration of a wireless communication environment that can be employed in conjunction with the various systems and methods described herein.

FIG. 14 shows an example wireless communication system 1400. The wireless communication system 1400 depicts one base station and one user device for sake of brevity. However, it is to be appreciated that the system can include more than one base station and/or more than one user device, wherein additional base stations and/or user devices can be substantially similar or different from the exemplary base station and user device described below. In addition, it is to be appreciated that the base station and/or the user device can employ the systems and/or methods described herein.

Referring now to FIG. 14, on a downlink, at access point 1405, a transmit (TX) data processor 1410 receives, formats, codes, interleaves, and modulates (or symbol maps) traffic data and provides modulation symbols ("data symbols"). A symbol modulator 1415 receives and processes the data symbols and pilot symbols and provides a stream of symbols. Symbol modulator 1415 multiplexes data and pilot symbols and provides them to a transmitter unit (TMTR) 1420. Each transmit symbol may be a data symbol, a pilot symbol, or a signal value of zero. The pilot symbols may be sent continuously in each symbol period. The pilot symbols can be frequency division multiplexed (FDM), orthogonal frequency division multiplexed (OFDM), time division multiplexed (TDM), frequency division multiplexed (FDM), or code division multiplexed (CDM).

TMTR 1420 receives and converts the stream of symbols into one or more analog signals and further conditions (e.g., amplifies, filters, and frequency upconverts) the analog signals to generate a downlink signal suitable for transmission over the wireless channel. The downlink signal is then transmitted through an antenna 1425 to the user devices. At user device 1430, an antenna 1435 receives the downlink signal and provides a received signal to a receiver unit (RCVR) 1440. Receiver unit 1440 conditions (e.g., filters, amplifies, and frequency downconverts) the received signal and digitizes the conditioned signal to obtain samples. A symbol demodulator 1445 demodulates and provides received pilot symbols to a processor 1450 for channel estimation. Symbol demodulator 1445 further receives a frequency response estimate for the downlink from processor 1450, performs data demodulation on the received data symbols to obtain data symbol estimates (which are estimates of the transmitted data symbols), and provides the data symbol estimates to an RX data processor 1455, which demodulates (e.g., symbol demaps), deinterleaves, and decodes the data symbol estimates to recover the transmitted traffic data. The processing by symbol demodulator 1445 and RX data processor 1455 is complementary to the processing by symbol modulator 1415 and TX data processor 1410, respectively, at access point 1405.

On the uplink, a TX data processor 1460 processes traffic data and provides data symbols. A symbol modulator 1465 receives and multiplexes the data symbols with pilot symbols, performs modulation, and provides a stream of symbols. A transmitter unit 1470 then receives and processes the stream of symbols to generate an uplink signal, which is transmitted by the antenna 1435 to the access point 1405.

At access point 1405, the uplink signal from user device 1430 is received by the antenna 1425 and processed by a receiver unit 1475 to obtain samples. A symbol demodulator 1480 then processes the samples and provides received pilot symbols and data symbol estimates for the uplink. An RX data processor 1485 processes the data symbol estimates to recover the traffic data transmitted by user device 1430. A processor 1490 performs channel estimation for each active user device transmitting on the uplink. Multiple user devices may transmit pilot concurrently on the uplink on their respective assigned sets of pilot subcarriers, where the pilot subcarrier sets may be interlaced.

Processors 1490 and 1450 direct (e.g., control, coordinate, manage, etc.) operation at access point 1405 and user device 1430, respectively. Respective processors 1490 and 1450 can be associated with memory units (not shown) that store program codes and data. Processors 1490 and 1450 can utilize any of the methodologies described herein. Respective Processors 1490 and 1450 can also perform computations to derive frequency and impulse response estimates for the uplink and downlink, respectively.

For a software implementation, the techniques described herein may be implemented with modules (e.g., procedures, functions, and so on) that perform the functions described herein. The software codes may be stored in memory units and executed by processors. The memory unit may be implemented within the processor or external to the processor, in which case it can be communicatively coupled to the processor via various means as is known in the art.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method of decoding a communication signal, the method comprising:

receiving a set of symbols containing a plurality of information bits;

dividing the received set of symbols into a plurality of subsets of symbols, each subset corresponding to the input of an inner code demodulation;

selecting a set of initial a priori values of the inner code demodulation for each subset of symbols;

demodulating each subset of symbols, using the initial a priori values of the subset of symbols and an inner code generator matrix, to generate a plurality of first soft information values as the output of the inner code demodulation;

associating each of the first soft information values to one of the plurality of information bits using an outer code generator matrix;

calculating a plurality of second soft information values as the output of the outer code demodulation, wherein each second soft information value corresponds to one of the information bits and is calculated using at least two of the first soft information values associated with the information bit;

determining a new set of a priori values of the inner code demodulation for each subset of symbols, using the second soft information values and the outer code generator matrix, and replacing the initial a priori values with the new a priori values; and repeating the demodulating, associating, calculating and determining actions at least once.

2. The method of claim 1, wherein demodulating utilizes non-coherent detection to demodulate the first soft information values.

3. The method of claim 1, wherein the second soft information value for a given information bit is an average of the at least two first soft information values associated with the information bit.

4. The method of claim 1, wherein the received set of symbols is divided into at least two subsets of symbols and the inner code generator matrix of the at least two subsets of symbols is the same.

5. The method of claim 4, wherein the inner code comprises a Reed-Muller code.

6. An apparatus that facilitates decoding a communication signal, comprising:

a receiver that receives a set of symbols containing a plurality of information bits and divides the received set of symbols into a plurality of subsets of symbols;

a decoder that selects a set of initial a priori values of the inner code demodulation for each subset of symbols;

an inner code demodulator that demodulates each subset of symbols, using the initial a priori values of the subset of symbols and an inner code generator matrix, to generate a plurality of first soft information values;

an interleaver that associates each of the first soft information values to one of the plurality of information bits using an outer code generator matrix;

an outer code demodulator that calculates a plurality of second soft information values, wherein each second soft information value corresponds to one of the information bits and is calculated using at least two of the first soft information values associated with the information bit; and a de-interleaver that determines a new set of a priori values of the inner code demodulation for each subset of symbols, using the second soft information values and the outer code generator matrix, and replaces the initial a priori values with the new a priori values for a next iteration of demodulation of the subsets of symbols.

7. The apparatus of claim 6, wherein inner code demodulator utilizes non-coherent detection to demodulate the first soft information values.

8. The apparatus of claim 6, wherein the second soft information value for a given information bit is an average of the at least two first soft information values associated with the information bit.

9. The apparatus of claim 6, wherein the received set of symbols is divided into at least two subsets of symbols and the inner code generator matrix of the at least two subsets of symbols is the same.

10. The apparatus of claim 9, wherein the inner code comprises a Reed-Muller code.

11. An apparatus that facilitates decoding a signal that enables antenna switching at a wireless terminal, comprising:

means for receiving a set of symbols containing a plurality of information bits;

means for dividing the received set of symbols into a plurality of subsets of symbols, each subset corresponding to the input of an inner code demodulation;

means for selecting a set of initial a priori values of the inner code demodulation for each subset of symbols;

means for demodulating each subset of symbols, using the initial a priori values of the subset of symbols and an inner code generator matrix, to generate a plurality of first soft information values as the output of the inner code demodulation;

means for associating each of the first soft information values to one of the plurality of information bits using an outer code generator matrix;

means for calculating a plurality of second soft information values as the output of the outer code demodulation, wherein each second soft information value corresponds to one of the information bits and is calculated using at least two of the first soft information values associated with the information bit;

means for determining a new set of a priori values of the inner code demodulation for each subset of symbols, using the second soft information values and the outer code generator matrix, and replacing the initial a priori values with the new a priori values; and means for repeating the demodulating, associating, calculating and determining actions at least once.

12. The apparatus of claim 11, wherein the means for demodulating utilizes non-coherent detection to demodulate the first soft information values.

13. The apparatus of claim 11, wherein the second soft information value for a given information bit is an average of the at least two first soft information values associated with the information bit.

14. The apparatus of claim 11, wherein the received set of symbols is divided into at least two subsets of symbols and the inner code generator matrix for the at least two subsets of symbols is the same.

15. The apparatus of claim 14, wherein the inner code comprises a Reed-Muller code.

16. A tangible computer-readable medium that stores outer-executable instructions for:

receiving a set of symbols containing a plurality of information bits;

dividing the received set of symbols into a plurality of subsets of symbols;

selecting a set of initial a priori values of the inner code demodulation for each subset of symbols;

demodulating each subset of symbols, using the initial a priori values of the subset of symbols and an inner code generator matrix, to generate a plurality of first soft information values;

associating each of the first soft information values with one of the plurality of information bits using an outer code generator matrix;

calculating a plurality of second soft information values, wherein each second soft information value corresponds to one of the information bits and is calculated using at least two of the first soft information values associated with the information bit;

determining a new set of a priori values of the inner code demodulation for each subset of symbols, using the second soft information values and the outer code generator matrix, and replacing the initial a priori values with the new a priori values; and repeating the demodulating, associating, calculating and determining actions at least once.

17. The tangible computer-readable medium of claim 16, further comprising instructions for utilizing non-coherent detection to demodulate the first soft information values.

18. The tangible computer-readable medium of claim 16, wherein the second soft information value for a given information bit is an average of the at least two first soft information values associated with the information bit.

19. The tangible computer-readable medium of claim 16, wherein the received set of symbols is divided into at least two subsets of symbols and the inner code generator matrix for the at least two subsets of symbols is the same.

20. The tangible computer-readable medium of claim 19, wherein the inner code comprises a Reed-Muller code.

21. A processor that executes computer-executable instructions for decoding a signal that enables antenna switching in a wireless terminal, the instructions comprising:

receiving a set of symbols containing a plurality of information bits;

dividing the received set of symbols into a plurality of subsets of symbols;

selecting a set of initial a priori values of the inner code demodulation for each subset of symbols;

demodulating each subset of symbols, using the initial a priori values of the subset of symbols and an inner code generator matrix, to generate a plurality of first soft information values;

associating each of the first soft information values with one of the plurality of information bits using an outer code generator matrix;

calculating a plurality of second soft information values, wherein each second soft information value corresponds to one of the information bits and is calculated using at least two of the first soft information values associated with the information bit;

determining a new set of a priori values of the inner code demodulation for each subset of symbols, using the second soft information values and the outer code generator matrix, and replacing the initial a priori values with the new a priori values; and repeating the demodulating, associating, calculating and determining actions at least once.

22. The processor of claim 21, the instructions further comprising utilizing non-coherent detection to demodulate the first soft information values.

23. The processor of claim 21, wherein the second soft information value for a given information bit is an average of the at least two first soft information values associated with the information bit.

24. The processor of claim 21, wherein the received set of symbols is divided into at least two subsets of symbols and the inner code generator matrix for the at least two subsets of symbols is the same.

25. The processor of claim 24, wherein the inner code comprises a Reed-Muller code.

* * * * *

UNITED STATES PATENT AND TRADEMARK OFFICE
CERTIFICATE OF CORRECTION

PATENT NO.         : 8,225,186 B2
APPLICATION NO.    : 11/487032
DATED              : July 17, 2012
INVENTOR(S)        : Hui Jin et al.

It is certified that error appears in the above-identified patent and that said Letters Patent is hereby corrected as shown below:

Title page, item [54] and Column 1, should be:

--ENCODING AND DECODING METHODS AND APPARATUS FOR USE IN A WIRELESS COMMUNICATION SYSTEM--

Signed and Sealed this
Twenty-seventh Day of November, 2012

David J. Kappos
*Director of the United States Patent and Trademark Office*